US007688638B2

(12) United States Patent
Hemink

(10) Patent No.: US 7,688,638 B2
(45) Date of Patent: Mar. 30, 2010

(54) FASTER PROGRAMMING OF MULTI-LEVEL NON-VOLATILE STORAGE THROUGH REDUCED VERIFY OPERATIONS

(75) Inventor: Gerrit Jan Hemink, Yokohama (JP)

(73) Assignee: Sandisk Corporation, Milpitas, CA (US)

( * ) Notice: Subject to any disclaimer, the term of this patent is extended or adjusted under 35 U.S.C. 154(b) by 101 days.

(21) Appl. No.: 11/952,295

(22) Filed: Dec. 7, 2007

(65) Prior Publication Data
US 2009/0147573 A1 Jun. 11, 2009

(51) Int. Cl.
G11C 16/06 (2006.01)

(52) U.S. Cl. .............................. 365/185.22; 365/185.19; 365/185.03; 365/185.17

(58) Field of Classification Search ............ 365/185.22, 365/185.17–185.19, 185.03
See application file for complete search history.

(56) References Cited

U.S. PATENT DOCUMENTS

| 5,570,315 | A | 10/1996 | Tanaka |
| 5,768,191 | A * | 6/1998 | Choi et al. ............. 365/185.22 |
| 5,774,397 | A | 6/1998 | Endoh |
| 6,046,935 | A | 4/2000 | Takeuchi |
| 6,222,762 | B1 | 4/2001 | Guterman |
| 6,343,033 | B1 | 1/2002 | Parker |
| 6,366,496 | B1 | 4/2002 | Torelli |
| 6,433,714 | B1 | 8/2002 | Clapp et al. |
| 6,643,188 | B2 | 11/2003 | Tanaka |
| 6,714,448 | B2 * | 3/2004 | Manea ................. 365/185.03 |
| 6,738,289 | B2 | 5/2004 | Gongwer |
| 6,859,397 | B2 | 2/2005 | Lutze |
| 6,917,542 | B2 | 7/2005 | Chen |
| 6,937,521 | B2 | 8/2005 | Avni et al. |
| 7,009,887 | B1 | 3/2006 | Hsia et al. |
| 7,023,736 | B2 | 4/2006 | Cernea |
| 7,046,568 | B2 | 5/2006 | Cernea |
| 7,054,193 | B1 | 5/2006 | Wong |
| 7,054,199 | B2 * | 5/2006 | Lee et al. ............... 365/185.22 |
| 7,085,341 | B2 | 8/2006 | Wells |
| 7,120,051 | B2 | 10/2006 | Gorobets |

(Continued)

OTHER PUBLICATIONS

U.S. Appl. No. 11/426,475, filed Jun. 26, 2006, titled "Method For Programming Non-Volatile Memory Using Variable Amplitude Programming Pulses,".

(Continued)

Primary Examiner—David Lam
(74) Attorney, Agent, or Firm—Vierra Magen Marcus & DeNiro LLP

(57) ABSTRACT

Programming speed for multi-level non-volatile storage elements is increased by reducing the number of verify operations. In one approach, verify operations are initially performed for the highest state less frequently than for other, lower states based on a recognition that a wider threshold voltage distribution for the highest state can be tolerated. After a number of additional programming pulses are applied, the frequency with which the verify operations are performed for the highest state increases. For example, for a four-level device in which state C is the highest state, C-state verify operations can be started when a first B-state element has been programmed and an additional number of program pulses have been applied. The C-state verify operations can be performed after every other program pulse until a certain number of C-state elements have been fully programmed, after which the C-state verify operations can be performed after every program pulse.

18 Claims, 19 Drawing Sheets

U.S. PATENT DOCUMENTS

| | | |
|---|---|---|
| 7,173,859 B2 | 2/2007 | Hemink |
| 7,196,928 B2 | 3/2007 | Chen |
| 7,196,931 B2 | 3/2007 | Cernea |
| 7,224,614 B1 | 5/2007 | Chan |
| 7,237,074 B2 | 6/2007 | Guterman |
| 7,254,071 B2 | 8/2007 | Tu et al. |
| 2006/0140007 A1 | 6/2006 | Cernea et al. |
| 2006/0158947 A1 | 7/2006 | Chan et al. |
| 2007/0035997 A1 | 2/2007 | Shibata et al. |
| 2007/0097747 A1 | 5/2007 | Li et al. |
| 2007/0097749 A1 | 5/2007 | Li et al. |
| 2007/0159891 A1 | 7/2007 | Tu et al. |
| 2007/0171725 A1 | 7/2007 | Chan |
| 2007/0177428 A1 | 8/2007 | Cohen et al. |
| 2007/0253250 A1 | 11/2007 | Shibata et al. |

OTHER PUBLICATIONS

U.S. Appl. No. 11/426,487, filed Jun. 26, 2006, titled "System For Programming Non-Volatile Memory Using Variable Amplitude Programming Pulses,".

* cited by examiner

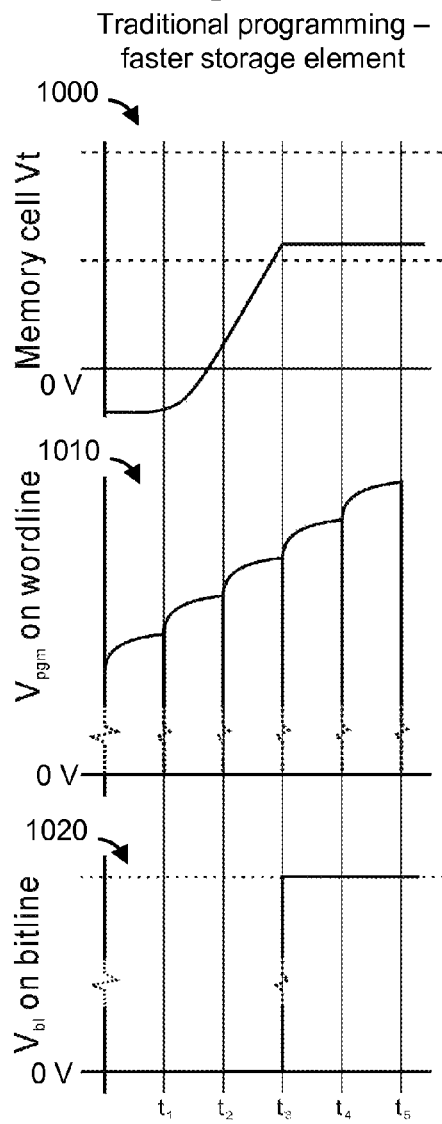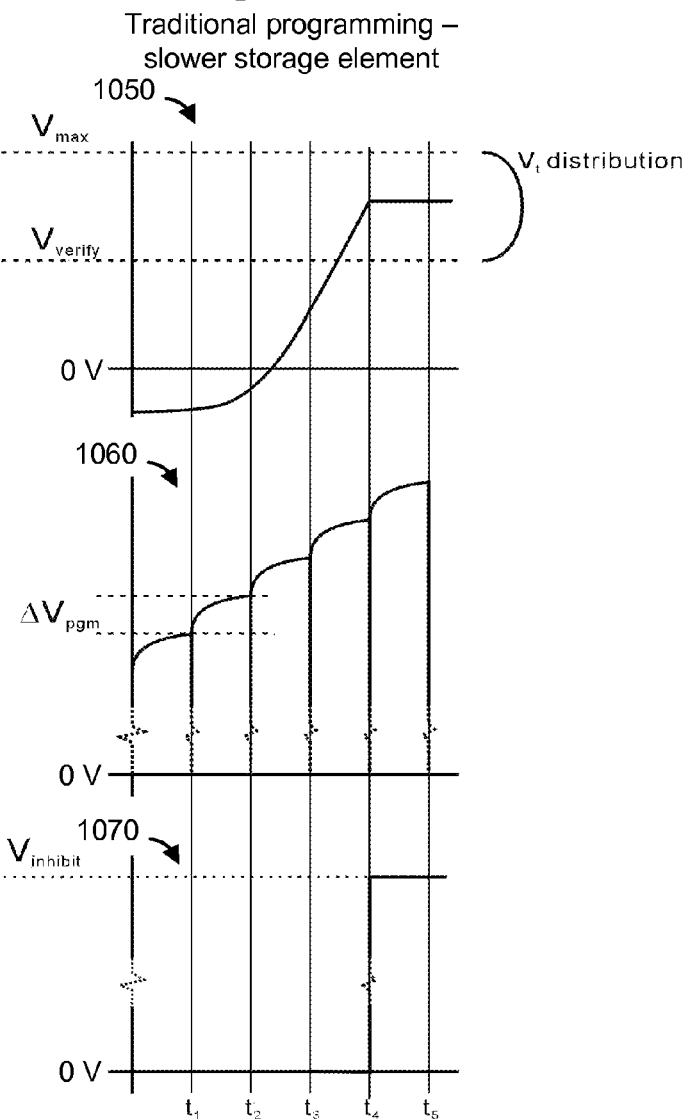

Traditional programming

Coarse/fine programming

Modified coarse/fine programming

Fig. 13
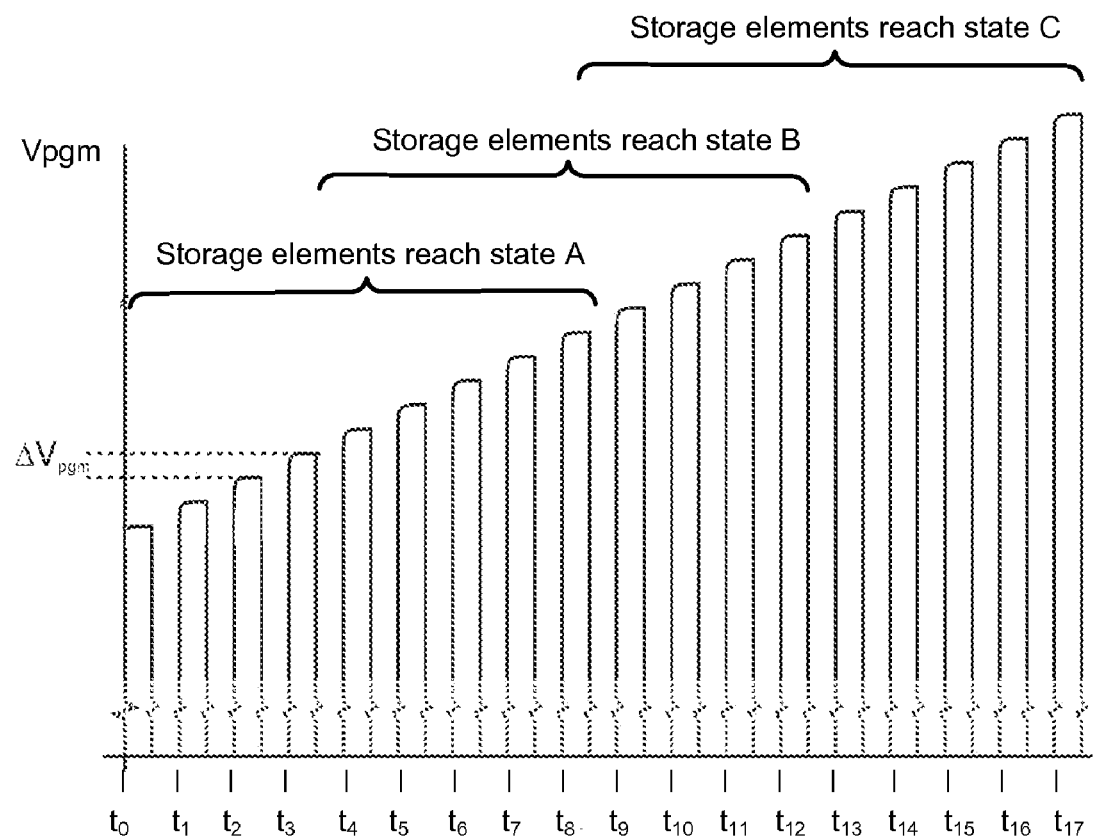
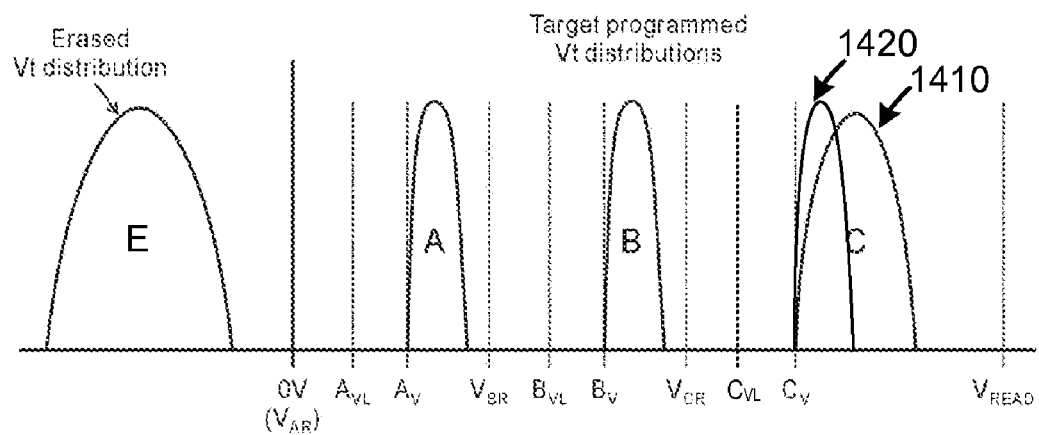
Fig. 14

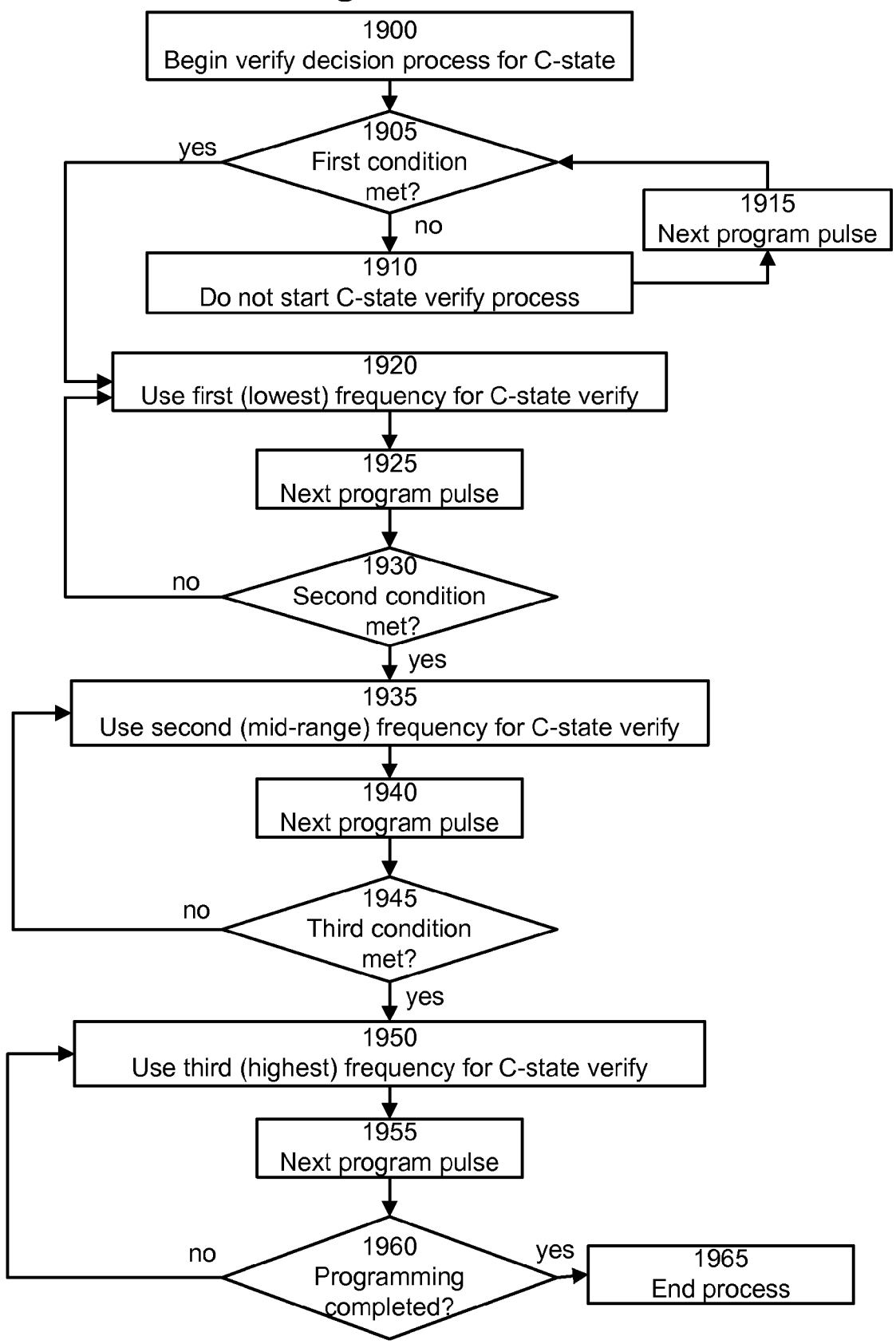

FASTER PROGRAMMING OF MULTI-LEVEL NON-VOLATILE STORAGE THROUGH REDUCED VERIFY OPERATIONS

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vt) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," issued Jul. 12, 2005; both of which are incorporated herein by reference in their entirety.

In multi-level storage devices, various programming techniques can be used to enhance performance in terms of obtaining narrower programmed threshold voltage (Vt) distributions and higher programming speeds. For example, a coarse/fine verify technique can be used in which an intermediate bit line voltage is applied to storage elements that have reached a specified verify level which is less than the final verify level. This slows down programming so that the Vt can be more precisely controlled. With coarse/fine verify and other approaches, often at least two of the multi-level states of the storage elements are programmed at once and, in some cases, all three programmed states (in the case of a 4-level memory) are programmed simultaneously, in what is often referred to as the full-sequence method. Full-sequence programming, especially in combination with an all-bitline (ABL) architecture, in which all storage elements on a word line are programmed at the same time rather than in an odd-even pattern, for instance, results in high programming speeds. However, for future memory devices, even higher programming speeds are needed. An improved programming technique is needed which addresses the above and other issues.

SUMMARY OF THE INVENTION

The present invention addresses the above and other issues by providing a system and method for increasing programming speed in non-volatile storage by reducing the number of verify operations.

In one embodiment, a method for programming multi-level non-volatile storage includes applying a set of programming pulses to a set of non-volatile storage elements, including a first group of non-volatile storage elements which are intended to be programmed to a first state, and a second group of non-volatile storage elements which are intended to be programmed to a second state. The method further includes performing n1 verify operations for one subset of programming pulses of the set to determine whether the non-volatile storage elements in the first group have reached the first state, and performing n2 verify operations for the one subset to determine whether the non-volatile storage elements in the second group have reached the second state, where n1>n2. The n2 verify operations include a verify operation between an initial programming pulse in the one subset and an immediately subsequent programming pulse.

In another embodiment, a method for programming multi-level non-volatile storage includes applying a set of programming pulses to a set of non-volatile storage elements for programming different ones of the non-volatile storage elements to different states, including a highest state and at least one lower state. The method further includes, for at least one portion of the programming pulses, performing verify operations with a first frequency for non-volatile storage elements which are intended to be programmed to the at least one lower state, and performing verify operations with a second, lower frequency for non-volatile storage elements which are intended to be programmed to the highest state. An initial verify operation of the verify operations for the non-volatile storage elements which are intended to be programmed to the highest state occurs between an initial programming pulse of the one portion and an immediately subsequent programming pulse.

In another embodiment, a method for programming multi-level non-volatile storage includes applying a set of programming pulses, including at least one subset of programming pulses and a distinct another set of programming pulses, to a set of non-volatile storage elements, where the another subset follows the one subset. The method further includes: a) performing a verify operation after each programming pulse in the one subset to determine whether non-volatile storage elements in the set which are intended to be programmed to a first state have reached the first state, b) performing a verify operation after fewer than each programming pulse in the one subset to determine whether non-volatile storage elements in the set which are intended to be programmed to a second state have reached the second state, and c) performing a verify operation after each programming pulse in the another subset to determine whether the non-volatile storage elements which are intended to be programmed to the second state have reached the second state.

In other embodiment, a non-volatile storage system is provided which includes a set of non-volatile storage elements and at least one control circuit associated with the set of non-volatile storage elements, where the at least one control circuit carries out the above-mentioned methods.

BRIEF DESCRIPTION OF THE DRAWINGS

FIG. 1b is an equivalent circuit diagram of the NAND string of FIG. 1a.

FIG. 1c is a cross-sectional view of the NAND string of FIG. 1a.

FIGS. 10a and 10b illustrate an example of a traditional programming process for two different non-volatile storage elements.

FIG. 13 illustrates a series of programming pulses with a fixed increment $\Delta Vpgm$ for programming multi-level non-volatile storage elements.

FIG. 14 illustrates threshold voltage distributions for E, A, B and C states.

FIG. 19a illustrates an example process for verifying C-state storage elements.

DETAILED DESCRIPTION

Figure 1A:
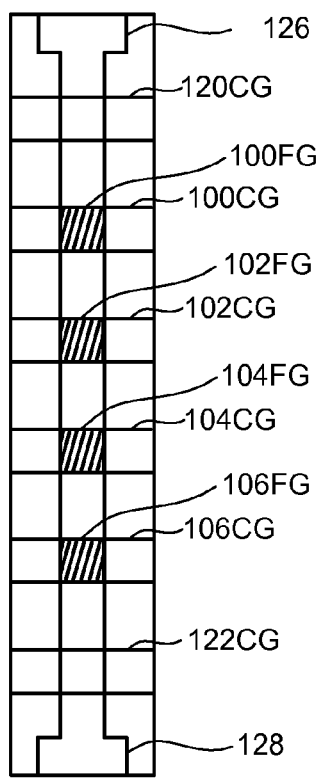
FIG. 1a is a top view of a NAND string.
Figure 1B:
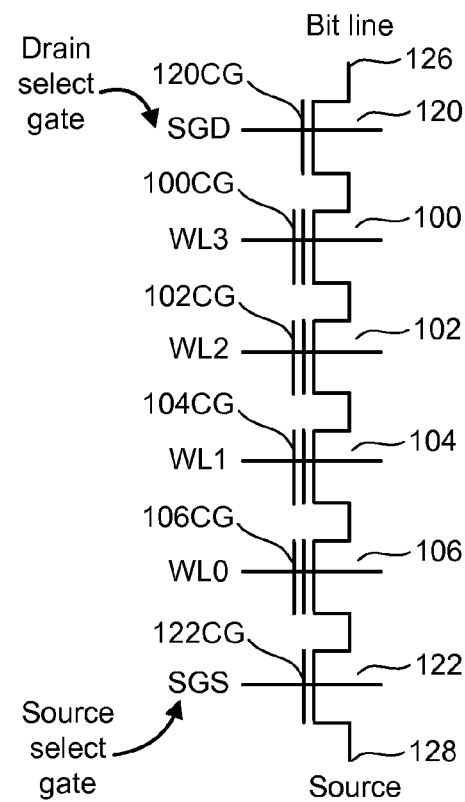

One example of a non-volatile memory system suitable for implementing the present invention uses the NAND flash memory structure, in which multiple transistors are arranged in series between two select gates in a NAND string. FIG. 1a is a top view showing one NAND string. FIG. 1b is an equivalent circuit thereof. The NAND string depicted in FIGS. 1a and 1b includes four transistors, 100, 102, 104 and 106, in series and sandwiched between a first select gate 120 and a second select gate 122. Select gates 120 and 122 connect the NAND string to bit line contact 126 and source line contact 128, respectively. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each storage elements. In other designs, the memory elements may include multiple transistors or may be different than those depicted in FIGS. 1a and 1b. Select gate 120 is connected to drain select line SGD, while select gate 122 is connected to source select line SGS.

Figure 1C:
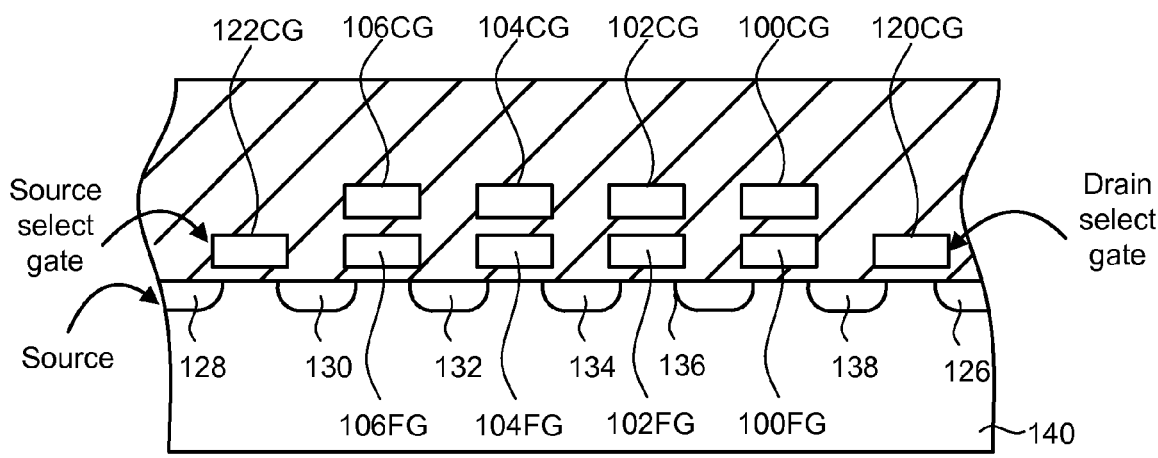

FIG. 1c provides a cross-sectional view of the NAND string described above. The transistors of the NAND string are formed in p-well region 140. Each transistor includes a stacked gate structure that includes a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory elements (100, 102, 104 and 106) form the word lines. N+ doped layers 130, 132, 134, 136 and 138 are shared between neighboring elements, whereby the elements are connected to one another in series to form the NAND string. These N+ doped layers form the source and drain of each of the elements. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a-c show four memory elements in the NAND string, the use of four transistors is provided only as an example. A NAND string used with the technology described herein can have less than four memory elements or more than four memory elements. For example, some NAND strings will include eight, sixteen, thirty-two, sixty-four or more memory elements. The discussion herein is not limited to any particular number of memory elements in a NAND string.

Generally, the invention can be used with devices that are programmed and erased by Fowler-Nordheim tunneling. The invention is also applicable to devices that use the nitride layer of a triple layer dielectric such as a dielectric formed of silicon oxide, silicon nitride and silicon oxide (ONO) to store charges instead of a floating gate. A triple layer dielectric formed of ONO is sandwiched between a conductive control gate and a surface of a semi-conductive substrate above the memory element channel. In some cases more than three dielectric layers may be used. Other layers, such as aluminum oxide, maybe used as well. An example of the latter is the Si-Oxide-SiN—Al$_2$O$_3$—TaN (TANOS) structure in which a triple layer of silicon oxide, silicon nitride and aluminum oxide is used. The invention can also be applied to devices that use, for example, small islands of conducting materials such as nano crystals as charge storage regions instead of floating gates. Such memory devices can be programmed and erased in a similar way as floating gate based NAND flash devices.

Figure 2:
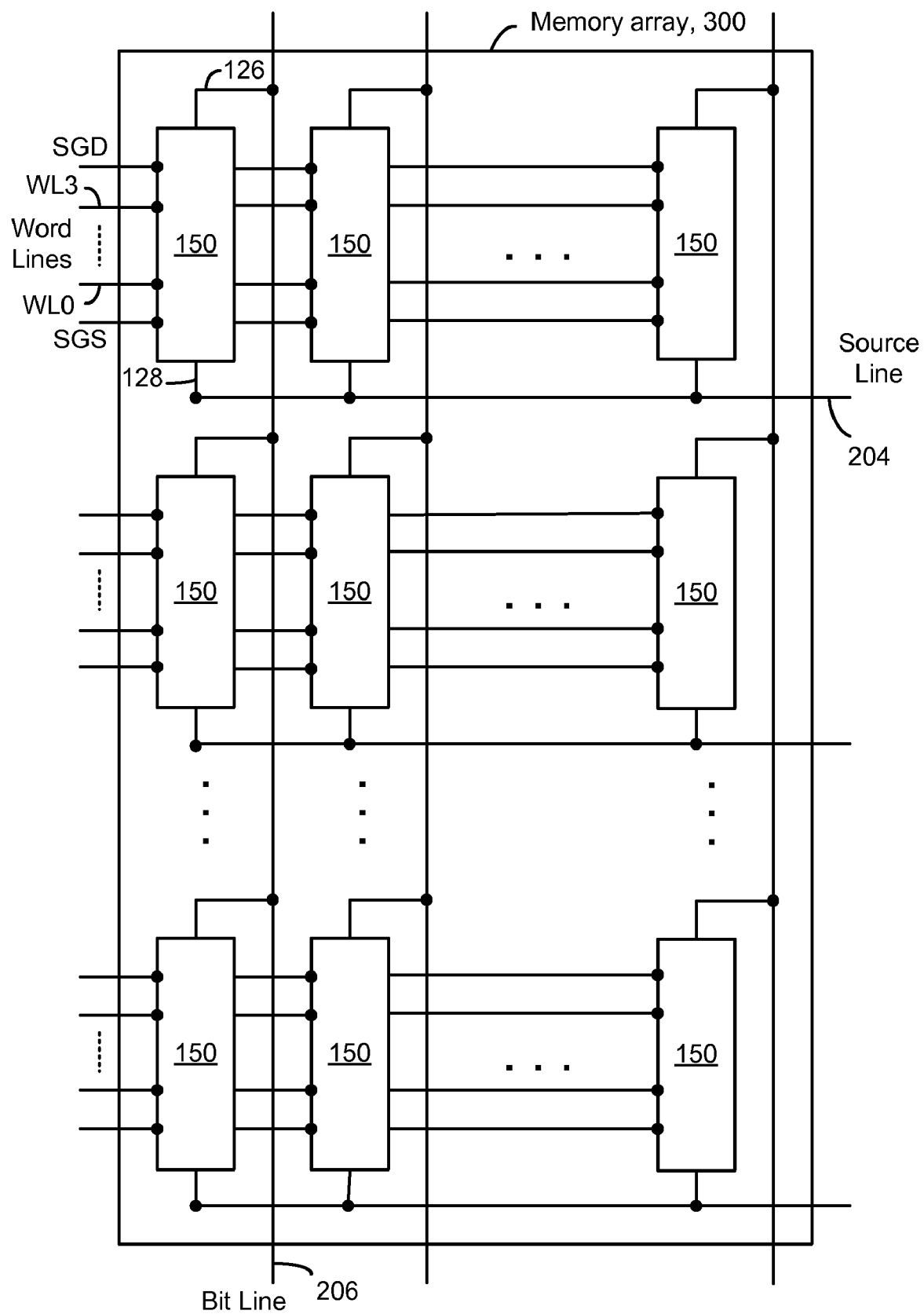
FIG. 2 is a block diagram of a portion of an array of NAND flash memory storage elements.

FIG. 2 illustrates an example of an array 300 of NAND storage elements, such as those shown in FIGS. 1a-c. Along each column, a bit line 206 is coupled to the drain terminal 126 of the drain select gate for the NAND string 150. Along each row of NAND strings, a source line 204 may connect all the source terminals 128 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into sectors and the sectors may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages.

Figure 3:
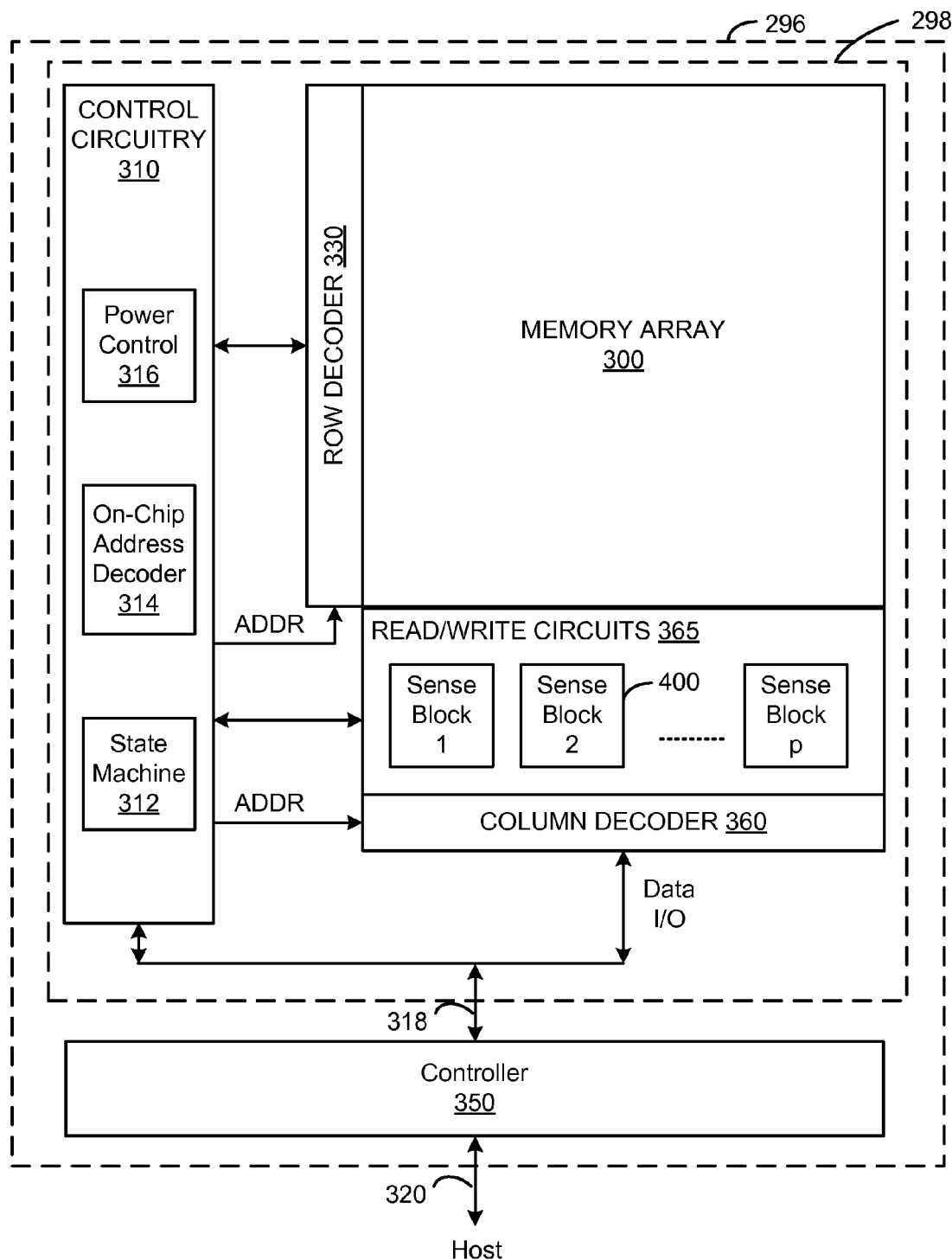
FIG. 3 is a block diagram of a non-volatile memory system.

FIG. 3 illustrates a memory device 296 having read/write circuits for reading and programming a page of storage elements in parallel, according to one embodiment of the present invention. Memory device 296 may include one or more memory die 298. Memory die 298 includes a two-dimensional array of storage elements 300, control circuitry 310, and read/write circuits 365. In some embodiments, the array of storage elements can be three dimensional. The memory array 300 is addressable by word lines via a row decoder 330 and by bit lines via a column decoder 360. Addressing is indicated by the notation "ADDR". The read/write circuits 365 include multiple sense blocks 400 and allow a page of storage elements to be read or programmed in parallel. Typically a controller 350 is included in the same memory device 296 (e.g., a removable storage card) as the one or more memory die 298. Commands and Data are transferred between the host and controller 350 via lines 320 and between the controller and the one or more memory die 298 via lines 318.

The control circuitry 310 cooperates with the read/write circuits 365 to perform memory operations on the memory array 300. The control circuitry 310 includes a state machine 312, an on-chip address decoder 314 and a power control module 316. The state machine 312 provides chip-level control of memory operations. The on-chip address decoder 314 provides an address interface between that used by the host or a memory controller to the hardware address used by the decoders 330 and 360. The power control module 316 controls the power and voltages supplied to the word lines and bit lines during memory operations.

In some implementations, some of the components of FIG. 3 can be combined. In various designs, one or more of the components of FIG. 3 (alone or in combination), other than storage element array 300, can be thought of as a managing circuit. For example, a managing circuit may include any one of or a combination of control circuitry 310, state machine 312, decoders 314/360, power control 316, sense blocks 400, read/write circuits 365, controller 350, etc.

Figure 4:
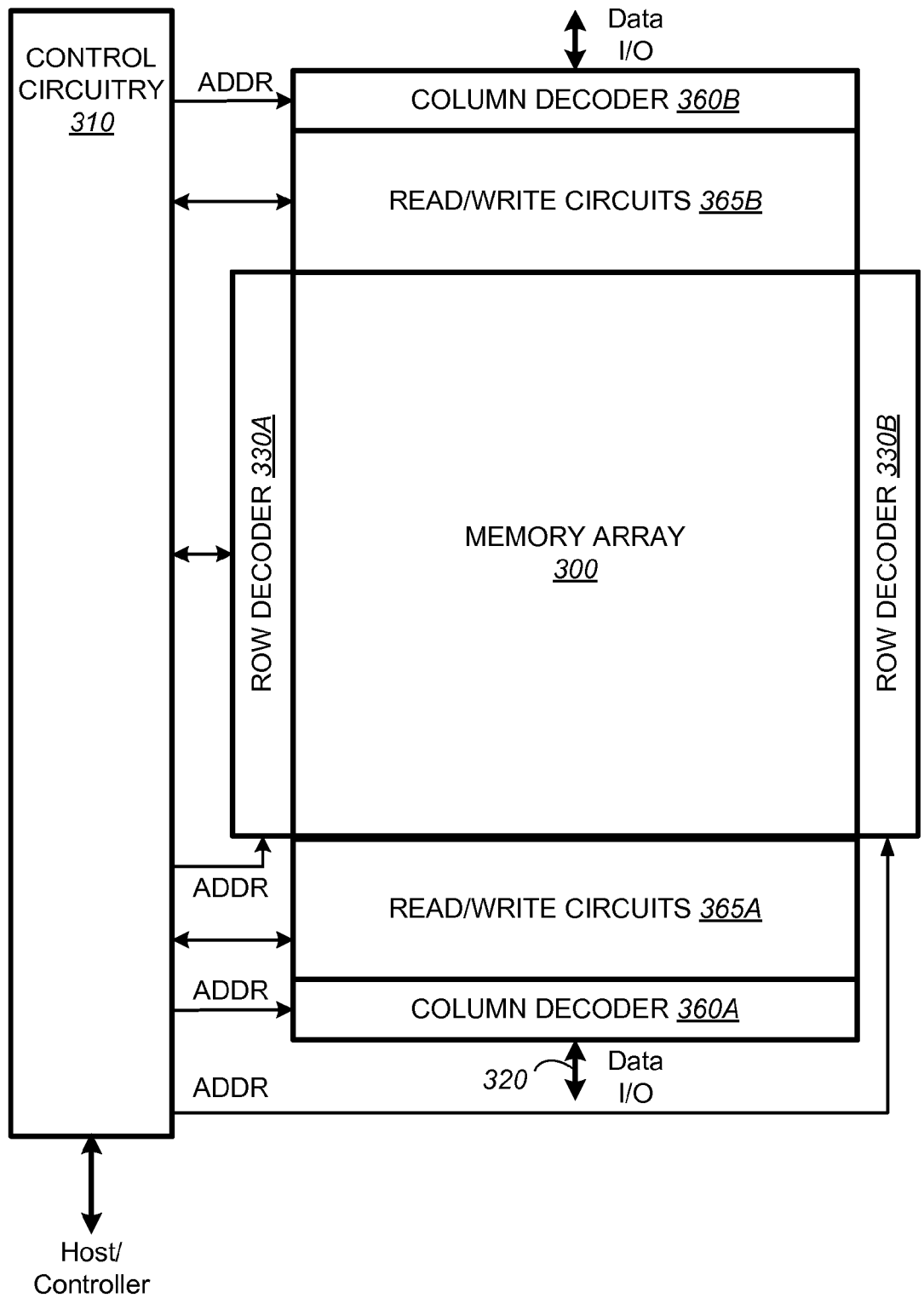
FIG. 4 is a block diagram of a non-volatile memory system.

FIG. 4 illustrates another arrangement of the memory device 296 shown in FIG. 3. Access to the memory array 300 by the various peripheral circuits is implemented in a symmetric fashion, on opposite sides of the array, so that the densities of access lines and circuitry on each side are reduced by half. Thus, the row decoder is split into row decoders 330A and 330B and the column decoder into column decoders 360A and 360B. Similarly, the read/write circuits are split into read/write circuits 365A connecting to bit lines from the bottom and read/write circuits 365B connecting to bit lines from the top of the array 300. In this way, the density of the read/write modules is essentially reduced by one half. The device of FIG. 4 can also include a controller, as described above for the device of FIG. 3.

Figure 5:
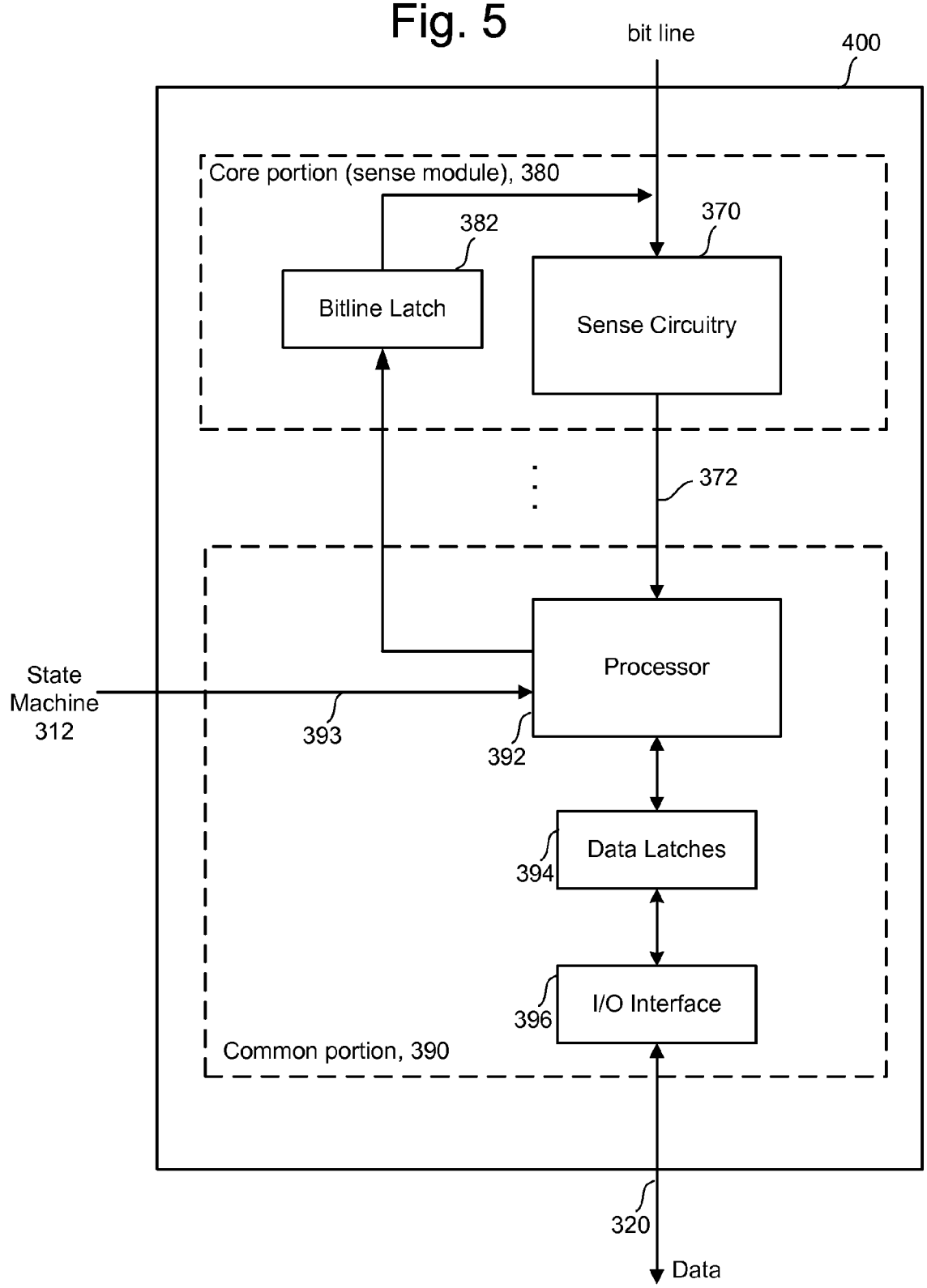
FIG. 5 is a block diagram depicting one embodiment of the sense block.

FIG. 5 is a block diagram of an individual sense block 400 partitioned into a core portion, referred to as a sense module or core portion 380, and a common portion 390. In one embodiment, there will be a separate sense module 380 for each bit line and one common portion 390 for a set of multiple sense modules 380. In one example, a sense block will include one common portion 390 and eight sense modules 380. Each of the sense modules in a group will communicate with the associated common portion via a data bus 372. For further details, refer to U.S. Patent App. Pub. 2006/0140007, titled "Non-Volatile Memory & Method with Shared Processing for an Aggregate of Sense Amplifiers," which is incorporated herein by reference in its entirety.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., Vdd).

Common portion 390 comprises a processor 392, a set of data latches 394 and an I/O Interface 396 coupled between the set of data latches 394 and data bus 320. Processor 392 performs computations. For example, one of its functions is to determine the data stored in the sensed storage element and store the determined data in the set of data latches. The set of data latches 394 is used to store data bits determined by processor 392 during a read operation. It is also used to store data bits imported from the data bus 320 during a program operation. The imported data bits represent write data meant to be programmed into the memory. I/O interface 396 provides an interface between data latches 394 and the data bus 320.

During read or sensing, the operation of the system is under the control of state machine 312 that controls the supply of different control gate voltages to the addressed storage elements. As it steps through the various predefined control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches 394. In another embodiment of the core portion, bit line latch 382 serves double duty, both as a latch for latching the output of the sense module 380 and also as a bit line latch as described above.

It is anticipated that some implementations will include multiple processors 392. In one embodiment, each processor 392 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all storage elements being programmed have reached the desired level. For example, when each storage element has reached its desired level, a logic zero for that storage element will be sent to the wired-OR line (or a data one is inverted). When all output lines output a data 0 (or a data one inverted), then the state machine knows to terminate the programming process. Because each processor communicates with eight sense modules, the state machine needs to read the wired-OR line eight times, or logic is added to processor 392 to accumulate the results of the associated bit lines such that the state machine need only read the wired-OR line one time.

During program or verify, the data to be programmed is stored in the set of data latches 394 from the data bus 320. The program operation, under the control of the state machine, comprises a series of programming voltage pulses applied to the control gates of the addressed storage elements. Each programming pulse is followed by a verify operation to determine if the storage element has been programmed to the desired state. Processor 392 monitors the verified memory state relative to the desired memory state. When the two are in agreement, the processor 392 sets the bit line latch 382 so as to cause the bit line to be pulled to a state designating program inhibit. This inhibits the storage element coupled to the bit line from further programming even if programming pulses appear on its control gate. In other embodiments the processor initially loads the bit line latch 382 and the sense circuitry sets it to an inhibit value during the verify process.

Data latch stack 394 contains a stack of data latches corresponding to the sense module. In one embodiment, there are three data latches per sense module 380. In some implementations (but not required), the data latches are implemented as a shift register so that the parallel data stored therein is converted to serial data for data bus 320, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Pat. No. 7,196,931, titled "Non-Volatile Memory And Method With Reduced Source Line Bias Errors," issued Mar. 27, 2007; (2) U.S. Pat. No. 7,023,736, titled "Non-Volatile Memory And Method with Improved Sensing," issued Apr. 4, 2006; (3) U.S. Pat. No. 7,046,568, titled "Improved Memory Sensing Circuit And Method For Low Voltage Operation," issued May 16, 2006; (4) U.S. Pat. No. 7,196,928, titled "Compensating for Coupling During Read Operations of Non-Volatile Memory," issued Mar. 27, 2007; and (5) U.S. Patent App. Pub. 2006/0158947, titled "Reference Sense Amplifier For Non-Volatile Memory, published Jul. 20, 2006. All five of the immediately above-listed patent documents are incorporated herein by reference in their entirety.

Figure 6:
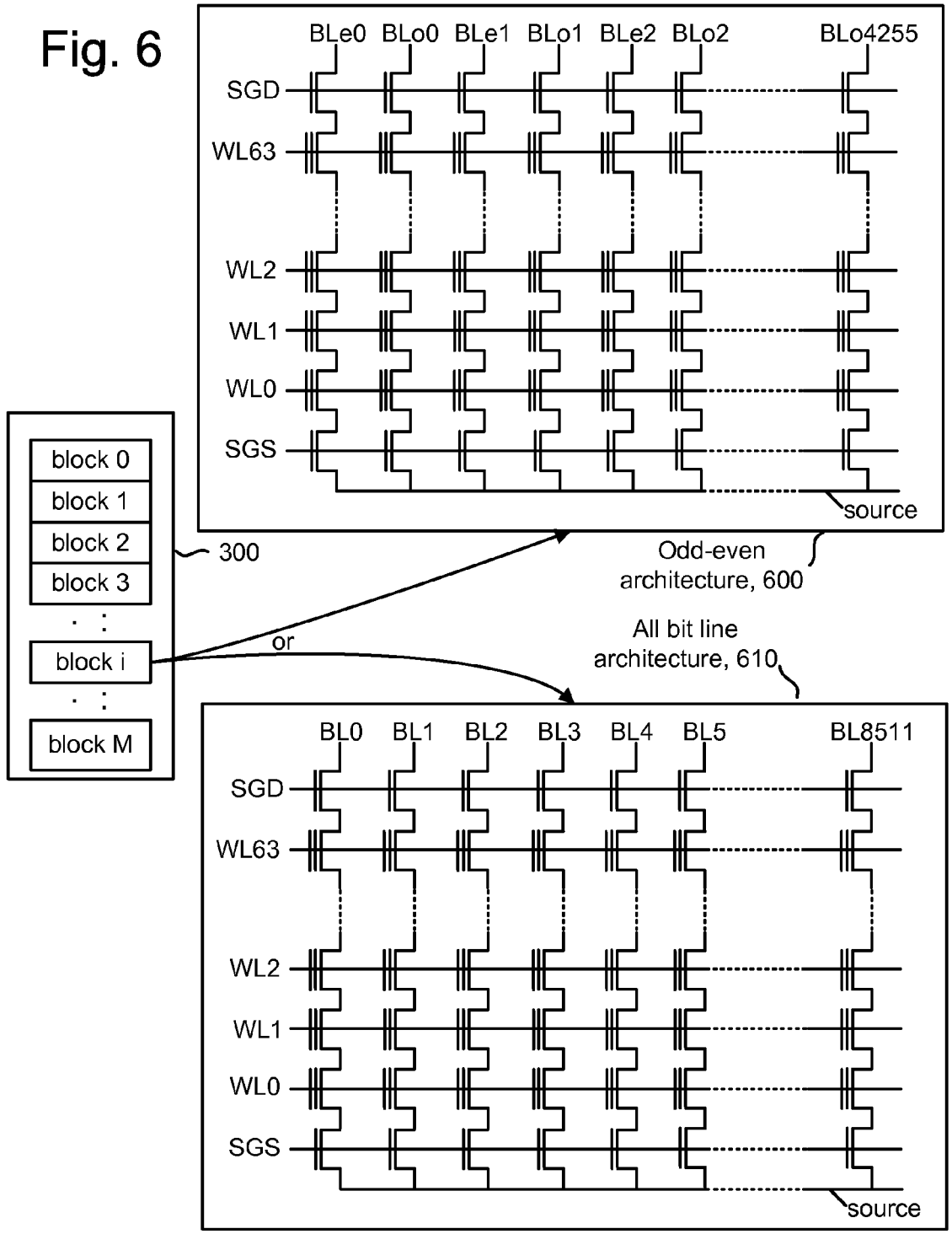
FIG. 6 is a block diagram of a memory array.

With reference to FIG. 6, an exemplary structure of storage element array 300 is described. As one example, a NAND flash EEPROM is described that is partitioned into 1,024 blocks (M=1,023). The data stored in each block can be simultaneously erased. In one embodiment, the block is the minimum unit of storage elements that are simultaneously erased. In one embodiment, depicted by an all bit line architecture 610 of an ith block, all the bit lines of a block can be simultaneously selected during read and program operations. Storage elements along a common word line and connected to any bit line can be programmed at the same time. In each block, in this example, there are 8,512 columns corresponding to bit lines BL0, BL1, . . . BL8511.

In another embodiment, depicted by an odd-even architecture 600 of an ith block, the bit lines are divided into even bit lines and odd bit lines. In an odd/even bit line architecture, storage elements along a common word line and connected to the odd bit lines are programmed at one time, while storage elements along a common word line and connected to even bit lines are programmed at another time. In each block, in this example, there are 8,512 columns corresponding to bit lines BLe0, BLo0, BLe1, BLo1, BLe2, BLo2 . . . BLo4255, where "e" denotes even and "o" denotes odd.

In the examples shown, sixty-four storage elements are connected in series to form a NAND string. Although sixty-four storage elements are shown to be included in each NAND string, fewer or more can be used (e.g., 4, 16, 32, 128, or another number). One terminal of the NAND string is connected to a corresponding bit line via a drain select gate (connected to select gate drain line SGD), and another terminal is connected to c-source via a source select gate (connected to select gate source line SGS).

Figure 7:
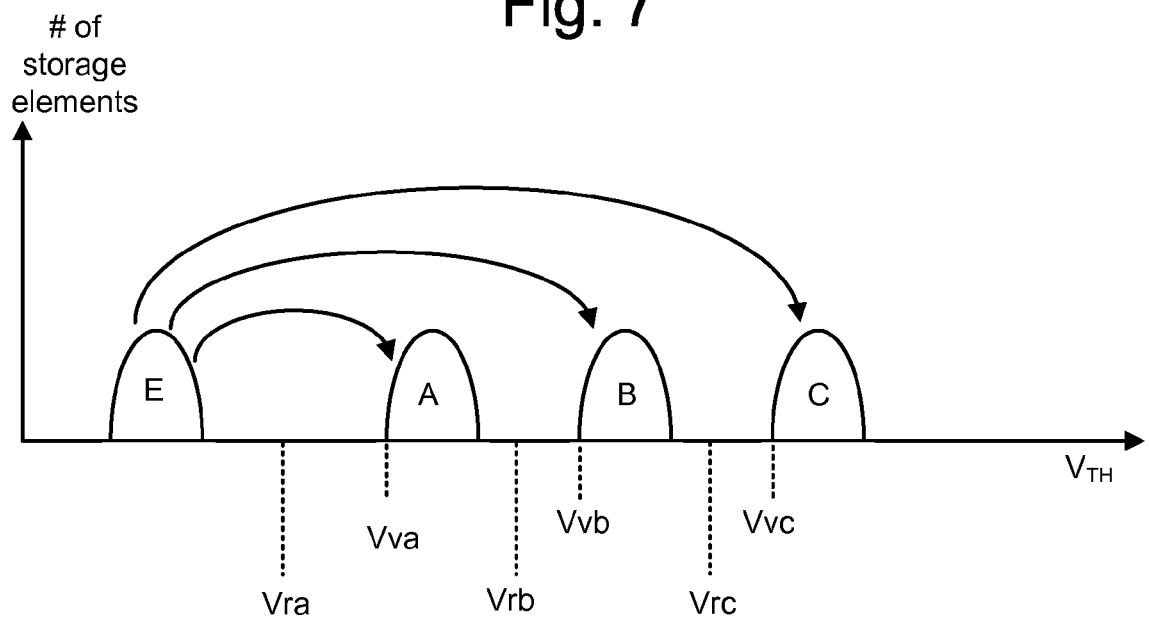
FIG. 7 depicts an example set of threshold voltage distributions.

FIG. 7 illustrates example threshold voltage distributions for the storage element array when each storage element stores two bits of data. FIG. 7 shows a first threshold voltage distribution E for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range of FIG. 7 corresponds to predetermined values for the set of data bits. The specific relationship between the data programmed into the storage element and the threshold voltage levels of the storage element depends upon the data encoding scheme adopted for the storage elements. For example, U.S. Pat. Nos. 6,222,762 and 7,237,074, "Tracking Cells For A Memory System," issued Jun. 26, 2007, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 7 shows four states, the present invention can also be used with other multi-state structures including those that include more or less than four states.

FIG. 7 also shows three read reference voltages, Vra, Vrb and Vrc, for reading data from storage elements. By testing whether the threshold voltage of a given storage element is above or below Vra, Vrb and Vrc, the system can determine what state the storage element is in. FIG. 7 also shows three verify reference voltages, Vva, Vvb and Vvc. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, which is a one-pass programming technique, storage elements can be programmed from the erase state E directly to any of the programmed states A, B or C. For example, a population of storage elements to be programmed may first be erased so that all storage elements in the population are in erased state E. While some storage elements are being programmed from state E to state A, other storage elements are being programmed from state E to state B and/or from state E to state C.

Figure 8:
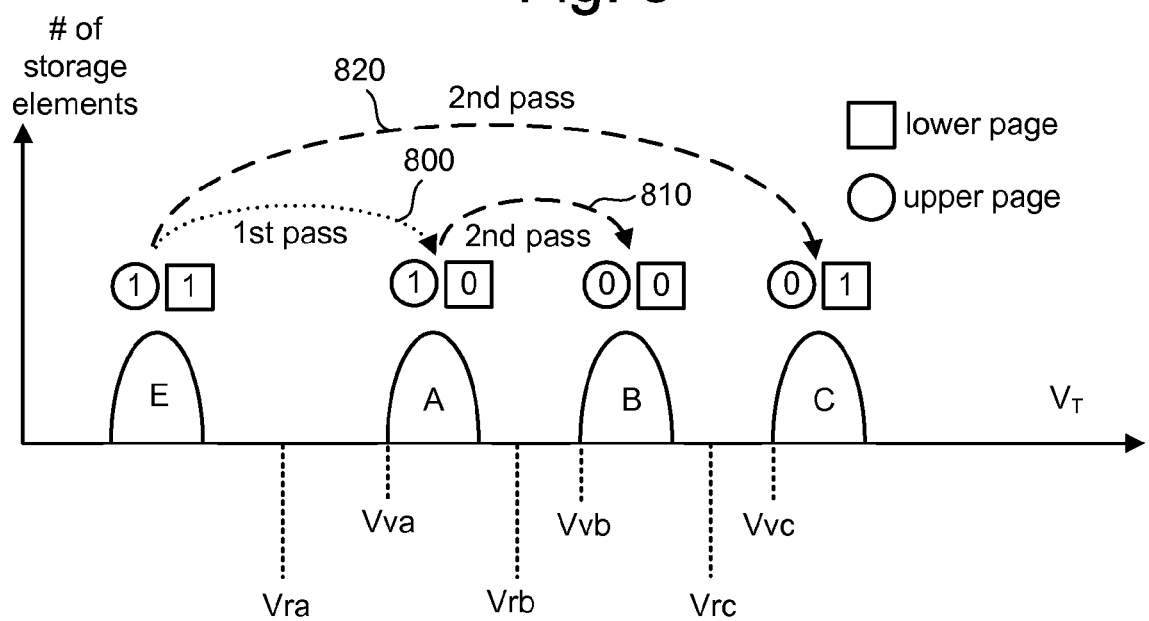
FIG. 8 depicts an example set of threshold voltage distributions.

FIG. 8 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 800.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 820. If the storage element had been programmed into state A as a result of the first programming pass, then the storage element is further programmed in the second pass so that the threshold voltage is increased to be within state B, as depicted by arrow 810. The result of the second pass is to program the storage element into the state designated to store a logic "0" for the upper page without changing the data for the lower page.

In one embodiment, a system can be set up to perform full sequence writing if enough data is written to fill up a word line. If not enough data is written, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Pat. No. 7,120,051, issued Oct. 10, 2006, titled "Pipelined Programming of Non-Volatile Memories Using Early Data," incorporated herein by reference in its entirety.

Figure 9A:
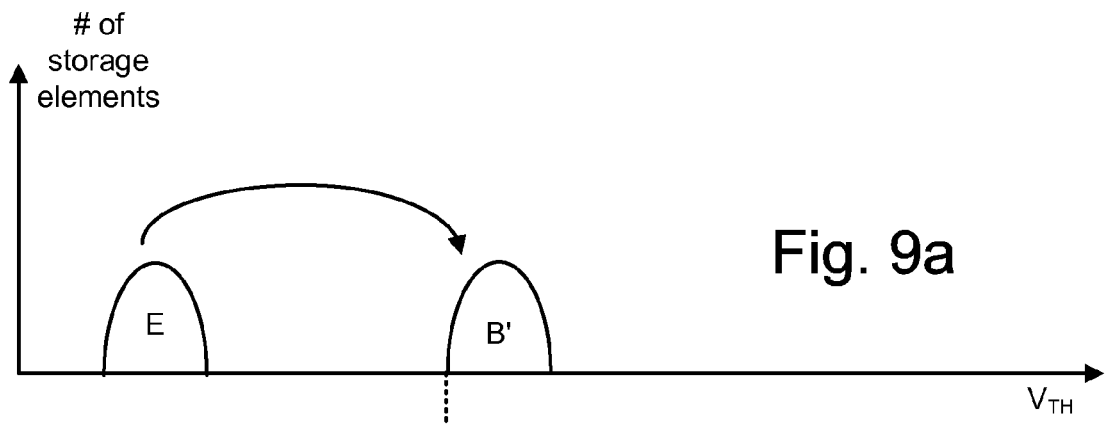
FIGS. 9a-c show various threshold voltage distributions and describe a process for programming non-volatile memory.
Figure 9B:
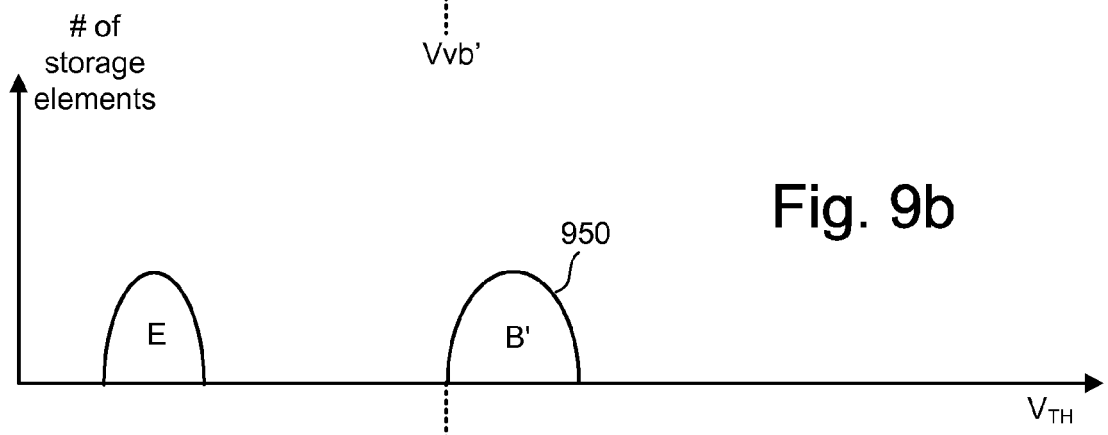
Figure 9C:
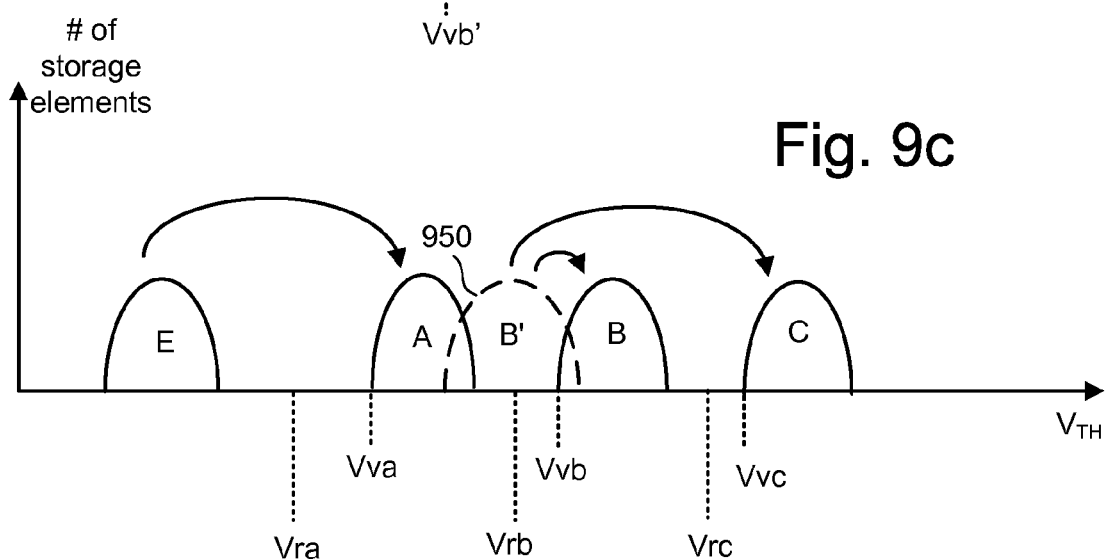

FIGS. 9a-c depict another process for programming non-volatile memory that reduces floating gate-to-floating gate coupling by, for any particular memory element, writing to that particular memory element with respect to a particular page subsequent to writing to adjacent memory elements for previous pages. In one example implementation, each of the non-volatile memory elements store two bits of data, using four data states. For example, assume that state E is the erased state and states A, B and C are the programmed states. State E stores data 11, state A stores data 01, state B stores data 10 and state C stores data 00. This is an example of non-Gray coding because both bits change between adjacent states A and B. Other encodings of data to physical data states can also be used. Each memory element stores bits from two pages of data. For reference purposes these pages of data will be called upper page and lower page; however, they can be given other labels. For state A, the upper page stores bit 0 and the lower page stores bit 1. For state B, the upper page stores bit 1 and the lower page stores bit 0. For state C, both pages store bit data 0. The programming process has two steps. In the first step, the lower page is programmed. If the lower page is to remain data 1, then the memory element state remains at state E. If the data is to be programmed to 0, then the threshold voltage Vt of the memory element is raised such that the memory element is programmed to state B'. FIG. 9a therefore shows the programming of memory elements from state E to state B', which represents an interim state B; therefore, the verify point is depicted as Vvb', which is lower than Vvb, depicted in FIG. 9c.

In one design, after a memory element is programmed from state E to state B', its neighbor memory element on an adjacent word line is programmed with respect to its lower page. After programming the neighbor memory element, the floating gate-to-floating gate coupling effect will raise the apparent threshold voltage of memory element under consideration, which is in state B'. This will have the effect of widening the threshold voltage distribution for state B' to that depicted as threshold voltage distribution 950 in FIG. 9b. This apparent widening of the threshold voltage distribution will be remedied when programming the upper page.

FIG. 9c depicts the process of programming the upper page. If the memory element is in erased state E and the upper page is to remain at 1, then the memory element will remain in state E. If the memory element is in state E and its upper page data is to be programmed to 0, the threshold voltage of the memory element will be raised so that the memory element is in state A. If the memory element is in state B' with the intermediate threshold voltage distribution 950 and the upper page data is to remain at 1, the memory element will be programmed to final state B. If the memory element is in state B' with the intermediate threshold voltage distribution 950 and the upper page data is to become data 0, the threshold voltage of the memory element will be raised so that the memory element is in state C. The process depicted by FIGS. 9a-c reduces the effect of floating gate-to-floating gate coupling because only the upper page programming of neighbor memory elements will have an effect on the apparent threshold voltage of a given memory element. An example of an alternate state coding is to move from distribution 450 to state C when the upper page data is a 1, and to move to state B when the upper page data is a 0. Although FIGS. 9a-c provide an example with respect to four data states and two pages of data, the concepts taught can be applied to other implementations with more or fewer than four states and more or fewer than two pages. More detail about various programming schemes and floating gate-to-floating gate coupling can be found in the above-mentioned U.S. Pat. No. 7,196,928.

Figure 9D:
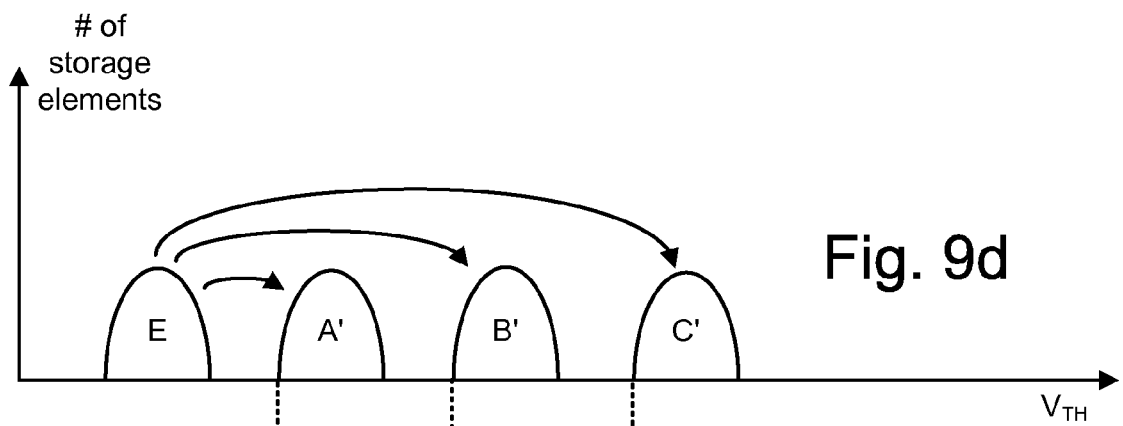
FIGS. 9d-f show various threshold voltage distributions and describe another process for programming non-volatile memory.
Figure 9E:
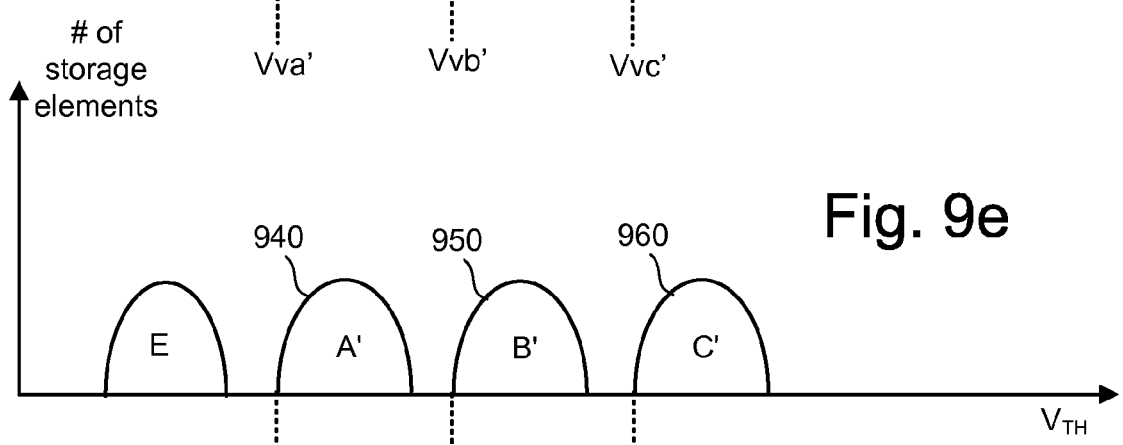
Figure 9F:
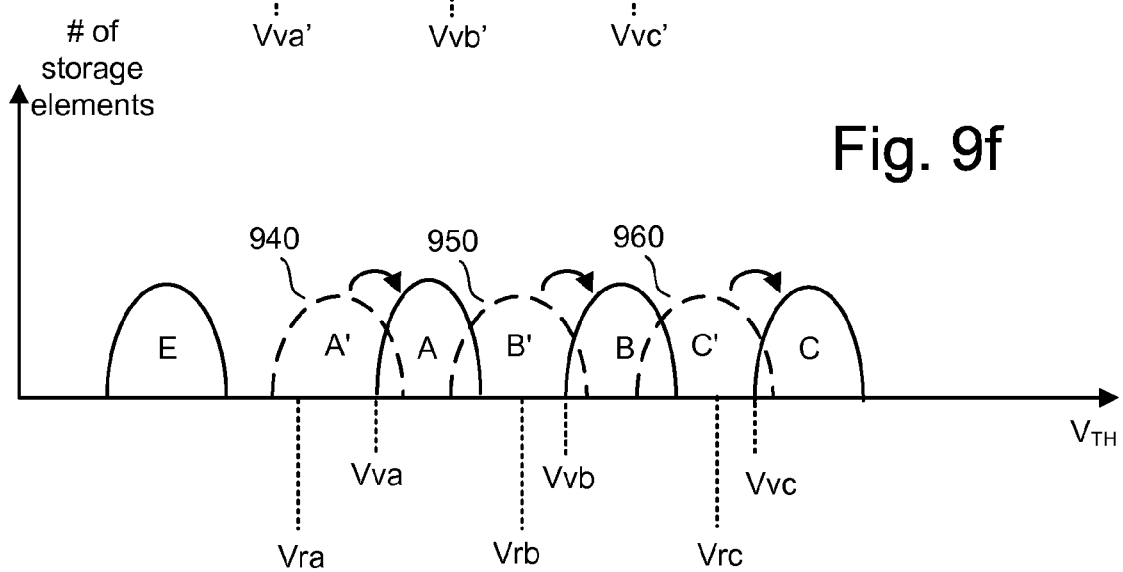

FIGS. 9d-f show various threshold voltage distributions and describe another process for programming non-volatile memory. This approach is similar to that of FIGS. 9a-c except that interim states A' and C' are used in addition to B'. Thus, if the lower page is to remain data 1 and the upper page is to remain data 1, then the memory element state remains at state E. If the data is to be programmed to 1 for the lower page and 0 for the upper page, then the Vt of the memory element is raised such that the memory element is programmed to state A'. If the data is to be programmed to 0 for the lower page and 1 for the upper page, then the Vt of the memory element is raised such that the memory element is programmed to state B'. If the data is to be programmed to 0 for the lower page and 0 for the upper page, then the Vt of the memory element is raised such that the memory element is programmed to state C'.

FIG. 9d therefore shows the programming of memory elements from state E to state A', B' or C', which represent interim states A, B and C, respectively; therefore, the verify points are depicted as Vva', Vvb' and Vvc', which are lower than Vva, Vvb and Vvc, respectively, depicted in FIG. 9f.

In one design, after a memory element is programmed from state E to state A', B' or C', its neighbor memory element on an adjacent word line is programmed. After programming the neighbor memory element, the floating gate-to-floating gate coupling effect will raise the apparent threshold voltage of memory element under consideration, which is in state A', B' or C'. This will have the effect of widening the threshold voltage distribution for state A', B' or C' to that depicted as threshold voltage distribution 940, 950 or 960 in FIG. 9e. This apparent widening of the threshold voltage distribution will be remedied during a next programming pass, as depicted in FIG. 9f. The memory elements in state A', B' or C' with the intermediate threshold voltage distributions 940, 950 and 960, respectively, are programmed to the final state A, B or C, respectively. The process depicted reduces the effect of floating gate-to-floating gate coupling further compared to the programming of FIGS. 9a-c because the shift in Vt of the neighbor memory elements is much smaller during the second programming pass. Although FIGS. 9d-f provide an example with respect to four data states and two pages of data, the concepts taught can be applied to other implementations with more or fewer than four states and more or fewer than two pages.

Generally, in multi-level NAND flash devices, various programming methods can be used to enhance performance. To obtain the highest performance in terms of narrow programmed Vt distributions and fast programming speed, one possible approach is to use a one-pass coarse/fine programming process. In a coarse mode, programming proceeds at a relatively quick pace until the Vt of a storage element is close to its final intended Vt, at which point a fine mode is used in which the programming proceeds at a slower pace, e.g., by raising a bit line voltage to partially inhibit programming. Furthermore, often at least two states are programmed at once, and in some cases, all three programmed states (in the case of a four-level MLC memory) are programmed simultaneously. In these cases, coarse/fine programming is normally used for the lowest states only. For the last state, which has the highest programmed level, the coarse/fine mode can have disadvantages, although it remains a viable option. For example, the highest state does not need a very tight Vt distribution and performing a coarse/fine technique instead of a normal write on the highest state requires more verify steps, resulting in a longer programming process.

Also, the coarse/fine mode may require more programming pulses since the programming is slowed down when the storage elements have almost reached their desired target state. This increase in the number of programming pulses can further reduce programming speed. Moreover, when each program pulse is higher than the previous pulse, the programming voltage will become higher and increase the amount of program disturb. The increase in the number of program pulses can be addressed in a modified programming technique in which a storage element is programmed initially in a coarse mode, as discussed, and when the Vt of the storage element is close to its final intended Vt, only one additional program pulse is applied. The bit line level may also be raised slightly when the additional program pulse is applied. So, from a program disturb point of view, the modified programming technique could be used for the highest Vt state.

A remaining fundamental problem of some programming techniques is that, for all states, the same Vpgm step size is used (for all states that are programmed simultaneously) although not all states need the same tight Vt distribution. Specifically, for the highest state, a wider Vt distribution can be tolerated; however, when the coarse/fine one-pass programming process or the modified programming process is used, the Vt distributions for the highest state are tighter than needed. This represents lost performance which can be partly recovered by performing a normal write on the highest Vt state, where the bit line is not raised to inhibit programming, thus reducing the time that is needed for the additional verify operation.

In other approaches, such as discussed in U.S. Pat. No. 7,173,859, titled "Faster Programming Of Higher Level States In Multi-Level Cell Flash Memory", issued Feb. 6, 2007, and incorporated herein by reference, a technique is provided in which the Vpgm step size is increased after the second highest state has finished programming, thereby reducing the amount of program and verify operations. However, due to the increased Vpgm step size, an absolute Vpgm level that is higher than actually needed to program the highest state may be applied, potentially causing more program disturb.

In some approaches, the Vpgm step size can be, but need not be, increased after the second highest state has finished programming. In a specific implementation, the Vpgm step size is constant in order to avoid an increase in program disturb due to the higher Vpgm that might result from an increased Vpgm step size. Further, programming time can be reduced by reducing the number of verify operations that are performed for the highest state without increasing program disturb. Specifically, for a number of programming pulses during which both the highest and the second highest states are programmed simultaneously, the number of highest state verify operations can be reduced by skipping the highest state verify operation after some of the programming pulses. For example, the verify operation can be skipped after every other programming pulse. Once the second highest state has finished programming and the highest state is close to finishing programming, the highest state verify operations can be carried out after each single programming pulse. In this way, the programming time can be reduced as the number of verify operations for the highest state is reduced, while Vpgm is not increased since the Vpgm step size and the number of programming pulses is not increased.

Many variations are possible. For example, after the second highest state has finished programming, the highest state verify operations may be performed after each programming pulse, or it is possible to continue skipping some of the verify operations until the highest state programming is partially completed, e.g., when a specified number or portion of storage elements which are intended to be programmed to the highest state have completed programming. In the latter case, faster programming results when more verify operations are skipped.

FIGS. 10a and 10b illustrate an example of a traditional programming process for two different non-volatile storage elements. The traditional programming process can be used for programming both binary and multi-level NAND storage devices. The storage element depicted by the graphs of FIG. 10a programs faster than that indicated by the graphs of FIG. 10b due to normal variations in storage element characteristics. Graphs 1000 and 1050 depict the threshold voltages (Vt) of the storage elements, graphs 1010 and 1060 depict the programming voltage Vpgm on a word line, which is the same in both cases, and graphs 1020 and 1070 depict the bitline voltage associated with the programmed storage elements. Note that the graphs 1010 and 1060 provide a simplification of the programming voltage Vpgm. In practice, a programming voltage similar to that of FIG. 13 can be provided where there are spaces between programming pulses and verify pulses are provided between the programming pulses.

At certain time intervals during programming, $t_1, t_2, t_3, \ldots$, a verify operation is carried out in which the Vt of the storage element is measured. If the Vt of the storage element is lower than the value of a verify voltage, Vverify, programming continues for that storage element. That is, the bitline voltage stays low, typically at 0 V. However, when the Vt of the storage element is higher than the verify voltage, programming during the subsequent programming pulses is inhibited by raising the bitline of the corresponding storage element to a high voltage, typically to the power supply voltage Vdd. In combination with the self-boosting method, or any other self-boosting method such as LSB or EASB, for instance, the channel area under the inhibited storage element will be boosted and therefore inhibit further programming of that storage element.

For example, graph 1000 indicates that the associated storage element reaches the verify level at $t_3$, at which point the bitline voltage steps up to the inhibit level, Vinhibit, as shown by graph 1020, and the storage element is locked out from further programming. Graph 1050 indicates that the associated storage element reaches the verify level at $t_4$, at which point the bitline voltage steps up to the inhibit level, Vinhibit, as shown by graph 1070, and the storage element is locked out from further programming. Graphs 1010 and 1060 show that, for each programming pulse, the programming voltage is increased by a fixed amount, $\Delta$Vpgm, as a result of which the Vt of the storage element during one programming pulse also increases by about the same amount, once the storage element has reached a linear programming regime. Generally, the Vt which is reached by each storage element programmed to the same state is within a Vt distribution as indicated, between Vverify and a maximum level, Vmax.

Figure 11A:
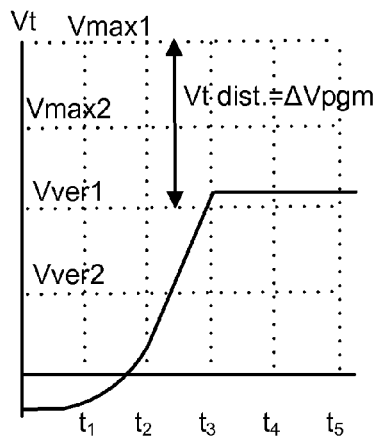
FIG. 11a illustrates a threshold voltage versus time relationship for a traditional programming process as well as a coarse/fine verify process in which the storage element does not reach a Vt state in between Vver1 and Vver2 at any of the verify points.
Figure 11B:
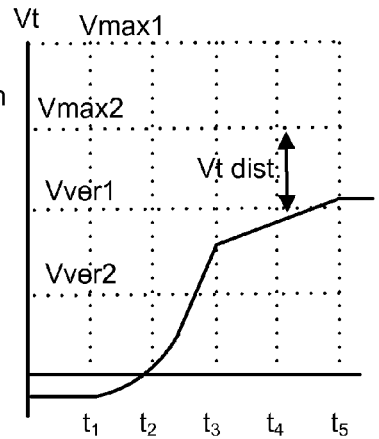
FIG. 11b illustrates a threshold voltage versus time relationship for a coarse/fine programming process.
Figure 11C:
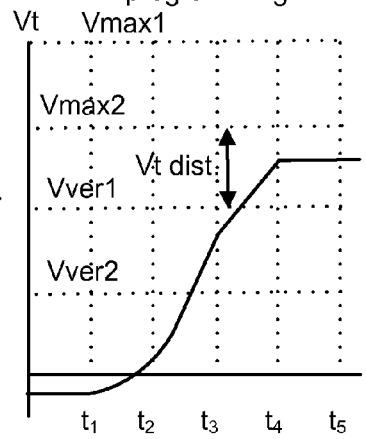
FIG. 11c illustrates a threshold voltage versus time relationship for a modified coarse/fine programming process.
Figure 12A:
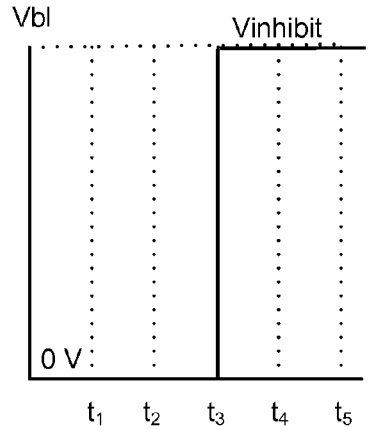
FIGS. 12a, 12b and 12c illustrate bit line voltage versus time relationships for the programming processes of FIGS. 11a, 11b and 11c, respectively.
Figure 12B:
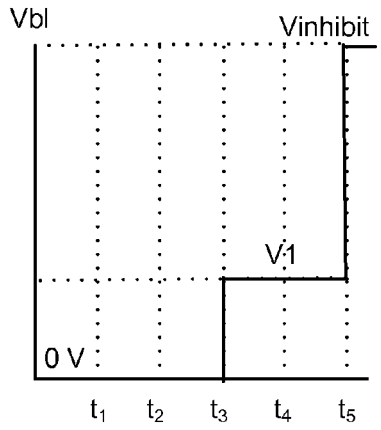
Figure 12C:
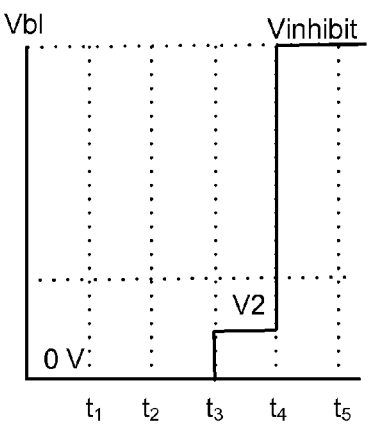

FIG. 11a illustrates a threshold voltage versus time relationship for a traditional programming process as well as a coarse/fine verify process in which the storage element does not reach a Vt state in between Vver1 and Vver2 at any of the verify points, while FIG. 11b illustrates a threshold voltage versus time relationship for a coarse/fine programming process, and FIG. 11c illustrates a threshold voltage versus time relationship for a modified coarse/fine programming process. FIGS. 12a, 12b and 12c illustrate bit line voltage (Vbl) versus time relationships for the programming processes of FIGS. 11a, 11b and 11c, respectively. The coarse/fine technique is used mainly in programming multi-level NAND storage elements, but can be used in programming binary devices as well. At certain time intervals or verify points during programming, $t_1, t_2, t_3, \ldots$, a verify operation is carried out in which the threshold voltage (Vt) of the storage element is measured.

As shown by FIGS. 11a and 12a, if the Vt of the storage element is lower than the value of a lower verify level, Vver2, programming continues for that storage element without inhibiting programming of the storage element. That is, the bitline voltage (Vbl) stays low, typically at 0 V. The storage element essentially bypasses the range between Vver1 and Vver2 between verify points $t_2$ and $t_3$. As a result, in both the traditional and coarse/fine programming of the example, the storage element is fully inhibited at $t_3$ without undergoing any partial inhibiting. At $t_3$, the storage element reaches a Vt state above Vver1, at which time Vbl steps up from 0 V to Vinhibit, which is typically the power supply voltage, Vdd, to fully inhibit programming. Thus, programming continues until Vt reaches the higher verify level, Vver1, after which programming during the subsequent programming pulses is inhibited by raising the bitline of the corresponding storage element to the inhibit voltage, Vinhibit. The Vt distribution generally extends between Vver1 and a value Vmax1 as indicated, and is equal to $\Delta$Vpgm. Note also that Vver2, Vver1, Vmax2 and Vmax1 differ for each programming state.

FIG. 11b represents an example of the normal coarse/fine programming process, and indicates how the storage element is partially inhibited from programming at $t_3$ when it reaches a Vt state in between Vver1 and Vver2, at which time the bit line voltage steps up to V1 (FIG. 12b). V1 is set at an intermediate level, typically about 0.5-1.0 V, which partially inhibits programming of the storage element. The channel voltage during programming will also be about the same as V1. The programming of the storage element is not fully inhibited but is slowed down, resulting in less Vt shift during the subsequent program pulses. At $t_4$, Vt is still between Vver2 and Vver1, so Vbl remains at V1. At $t_5$, the storage element reaches a Vt state above Vver1, at which time the bit line voltage steps up from V1 to Vinhibit to fully inhibit programming. With the coarse/fine programming processes, the programmed Vt distribution is narrower than with the traditional programming process because the storage element's Vt shift is reduced once the Vt has come close to the target Vt value of the desired programmed state. In particular, the Vt distribution generally extends between Vver1 and Vmax2 as indicated.

FIG. 11c represents an example of a modified coarse/fine programming process in which a reduced inhibit voltage V2 is used, where V2<V1. In this example, the storage element is partially inhibited from programming at $t_3$ when it reaches a Vt state in between Vver1 and Vver2, at which time the bit line voltage steps up to V2 (FIG. 12c). The channel voltage during programming will also be about the same as V2. Since V2<V1, the rate at which the storage element is programmed when Vbl=V2 is higher than if Vbl=V1. That is, programming of the storage element is slowed down less than with the traditional coarse/fine programming process. At the next verify time $t_4$, after one additional programming pulse has been applied, the storage element is assumed to reach a Vt state above, or at least close to, Vver1, at which time Vbl steps up from V1 to Vinhibit to fully inhibit programming.

With the modified coarse/fine programming, in order to obtain the best performance, V1 should be chosen in such a way that the Vt shift of the storage element during the next programming pulse, equals $\Delta$Vpgm/2. For example, V1=0.3 V. If Vver1 and Vver2 are chosen in an appropriate way, the Vt of the storage element should then be higher than Vver1 (the target value) after only one additional programming pulse. Only one additional programming pulse is provided regardless of whether the storage element's Vt after that one additional pulse is higher or lower than the final target level, Vver1. An advantage of the modified coarse/fine programming process is that fewer programming pulses are needed than with the traditional coarse/fine programming process, resulting a shorter programming time and reduced program disturb, especially when used for the highest programmed Vt state. The Vt distribution generally extends between Vver1 and Vmax2 as indicated.

FIG. 13 illustrates a series of programming pulses with a fixed increment $\Delta$Vpgm for programming multi-level non-volatile storage elements. The programming pulses are applied to the word line selected for programming. Generally, a single programming pulse can have a fixed amplitude or varying amplitude. For example, a varying amplitude can include step wise variations and/or ramped variations. Examples of programming pulses with varying amplitudes are discussed in co-pending U.S. patent application Ser. No. 11/426,475, filed Jun. 26, 2006, titled "Method For Programming Non-Volatile Memory Using Variable Amplitude Programming Pulses," incorporated herein by reference. One or more verify pulses (not depicted) can be provided in between the program pulses. In some embodiments, there can be a verify pulse for each state that data is being programmed into. In other embodiments, there can be fewer verify pulses. In one embodiment, data is programmed to storage elements along a common word line. Thus, prior to applying the program pulses, one of the word lines is selected for programming. This word line will be referred to as the selected word line. The remaining word lines of a block are referred to as the unselected word lines.

In particular, programming of multi-level storage elements is achieved here by applying successive fixed-amplitude programming pulses, where the fixed amplitude increases for successive pulses by a constant increment $\Delta$Vpgm in an ascending staircase. With full sequence programming, states A, B and C are programmed at the same time. Typically, coarse/fine verify is used for the A and B states while the traditional programming process is used for the C state. In the example provided, it takes about nine pulses (from t0-t8) to program each Vt state, with the A-state, B-state and C-state storage elements generally reaching their intended states at different times. However, due to variations in programming speed of individual storage elements, there is generally some overlap such that, e.g., some B-state storage elements will reach their intended state before some A-state storage elements, and some C-state storage elements will reach their intended state before some B-state storage elements. Although all three states are programmed at the same time, a higher programming voltage is required for the B and C state storage elements, and more programming pulses may be needed with an increasing programming voltage after the A state has finished programming. In this example, storage elements reach state A after program pulses at t0-t8 (after nine total program pulses), storage elements reach state B after program pulses at t4-t12 (after thirteen total program pulses) and storage elements reach state C after program pulses at t8-t17 (after eighteen total program pulses). The storage elements which have reached their final intended state are inhibited from further programming.

FIG. 14 illustrates threshold voltage distributions for E, A, B and C states. The E state represents the erased state. $V_{AR}$, $V_{BR}$ and $V_{CR}$ represent the read voltages for the A, B and C states, respectively. When used, $A_{VL}$, $B_{VL}$ and $C_{VL}$ represent lower verify levels for coarse/fine programming for the A, B and C states, respectively, although in many cases, coarse/fine programming for the C state is not used. $A_V$, $B_V$ and $C_V$ represent the verify voltages for the A, B and C states, respectively. These are also the upper verify levels for coarse/fine programming, when used.

In one approach, the relatively narrow Vt distributions for states A and B are achieved using the coarse/fine verify process (described in FIG. 11b and 12b), while the wider C state distribution 1410 is reached using the traditional write process (described in FIG. 11a and 12a). Typically, the B and C state distributions are programmed at the same time. However, it is also possible to program all three distributions (A, B and C) at the same time. Moreover, typically, one-pass coarse/fine programming is used for the A and B states while the traditional write is used for the C state.

In another approach, the narrower C state distribution 1420 is reached using the modified coarse/fine programming process (described in FIG. 11c and 12c). Normally, coarse/fine programming (normal or modified) is not used for the C state in order to reduce program disturb and programming time. For the C state, the wider Vt distribution 1410 is usually acceptable.

In another approach, the wider C state distribution 1410 is reached using the coarse/fine programming (normal or modified) with a larger Vpgm step size (e.g., as discussed below in connection with FIGS. 15 and 16). The use of a larger $\Delta$Vpgm step size can result in fewer programming pulses needed for programming and, therefore, a shorter programming time.

Figure 15:
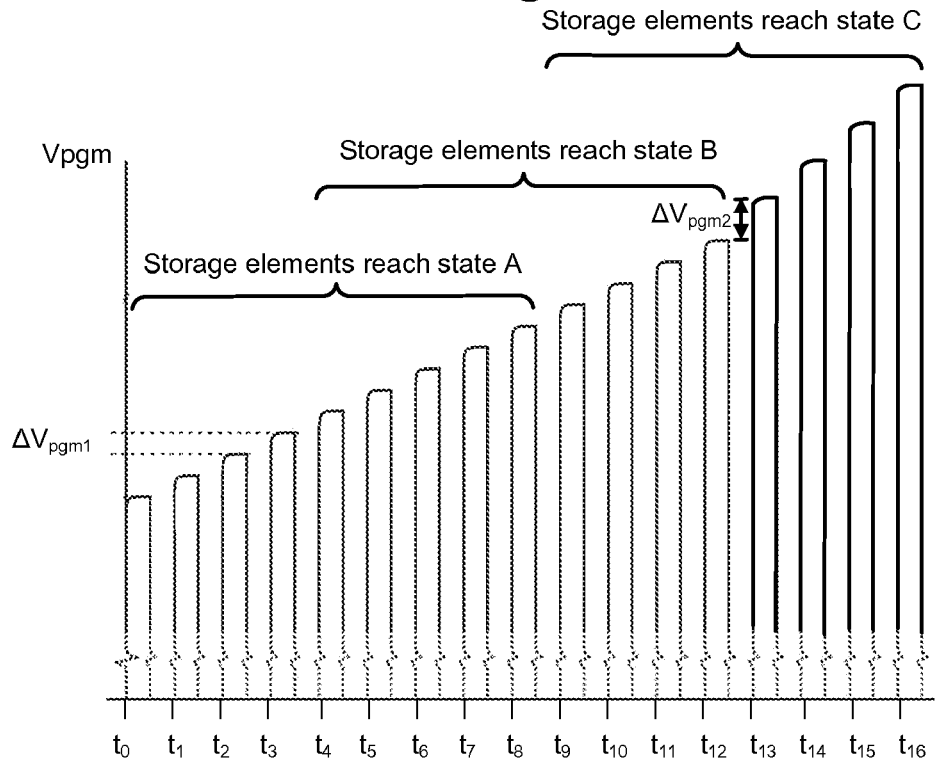
FIG. 15 illustrates a series of programming pulses with a first fixed increment $\Delta Vpgm1$ followed by a second fixed increment $\Delta Vpgm2$.

FIG. 15 illustrates a series of programming pulses with a first fixed increment $\Delta$Vpgm1 followed by a second fixed increment $\Delta$Vpgm2. This approach varies from that shown in FIG. 13 in that a first subset of the program pulses, e.g., at t0-t12, increase step wise by the step size $\Delta$Vpgm1 while a second subset of program pulse, e.g., at t13-16, increase step wise by the step size $\Delta$Vpgm2, where $\Delta$Vpgm2>$\Delta$Vpgm1. In one possible implementation, the increase in step size starts after all, or a specified number, of the B-state storage elements have finished programming to their intended state. The higher step size is useful is achieving faster programming of the C-state storage elements to the highest state. In this example, storage elements reach state A after program pulses at t0-t8, storage elements reach state B after program pulses at t4-t12 and storage elements reach state C after program pulses at t8-t16.

Note that the relatively wide C-state distribution 1410 of FIG. 14 may be achieved using the series of programming pulses of FIG. 15. However, as mentioned, this is acceptable as the C-state storage elements can still be read with sufficient accuracy. Further, the use of a larger step size and the resulting larger absolute Vpgm can speed programming of the C-state storage elements which have not yet reached their intended state, compared to the series of programming pulses of FIG. 13, which use a fixed $\Delta$Vpgm, and therefore require additional pulses, and additional programming time, to reach the same absolute Vpgm. This increase in programming speed is depicted by the series of programming pulses of FIG. 15 including one fewer program pulse than in FIG. 13, as an example (e.g., 16 vs. 17 program pulses).

Further, during B-state programming, some of the fastest storage elements will have reached the C-state. Those C-state storage elements are therefore programmed only using the smaller Vpgm step size, $\Delta$Vpgm1. Moreover, coarse/fine programming is not needed for those storage elements. When all B-state storage elements have finished programming, both the Vpgm step size and the verify method can be changed. For example, the step size can be increased to $\Delta$Vpgm2 and, instead of the traditional programming process with only one verify level per state, the programming can switch to the normal or modified coarse/fine programming using two verify levels per state. In one example implementation, $\Delta$Vpgm2 is about twice as large as $\Delta$Vpgm1, and modified coarse/fine programming is used for the C-state storage elements.

Figure 16:
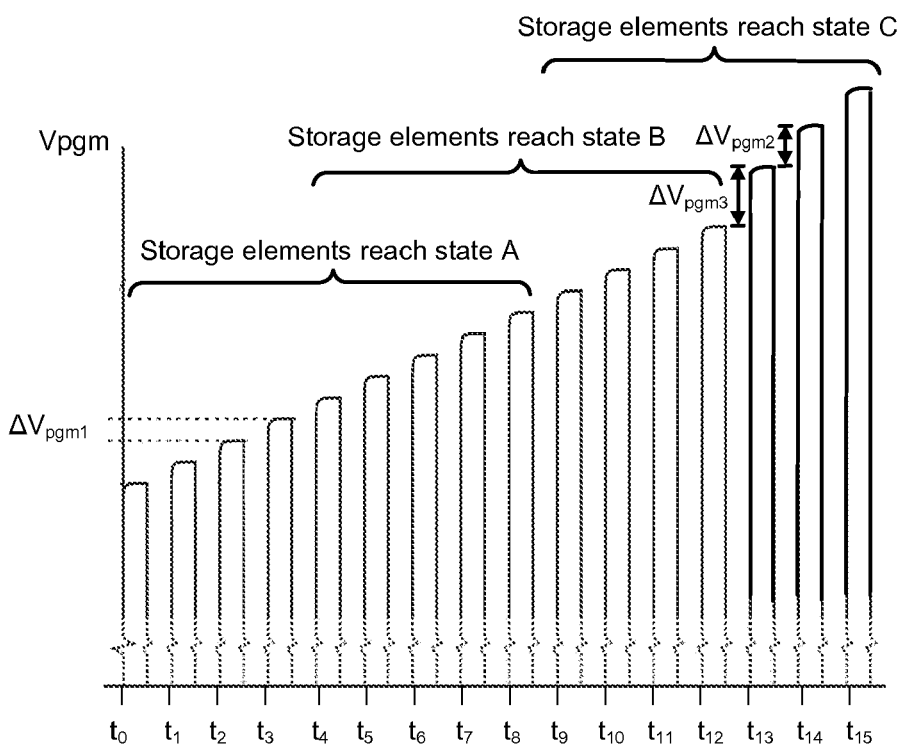
FIG. 16 illustrates a series of programming pulses with a first fixed increment $\Delta Vpgm1$ followed by a second fixed increment $\Delta Vpgm3$ and a third fixed increment $\Delta Vpgm2$.

FIG. 16 illustrates a series of programming pulses with a first fixed increment $\Delta$Vpgm1 followed by a second fixed increment $\Delta$Vpgm3 and a third fixed increment $\Delta$Vpgm2. This approach varies from that shown in FIG. 15 in that the additional step size $\Delta$Vpgm3 is used after all, or a specified number, of the B-state storage elements have finished programming to the intended state. Generally, $\Delta$Vpgm2>$\Delta$Vpgm1, e.g., by a factor of two. Further, typically but not necessarily, $\Delta$Vpgm3>$\Delta$Vpgm2. Providing the larger step size Vpgm3 for one or more program pulses can speed programming. In this example, storage elements reach state A after program pulses at t0-t8, storage elements reach state B after program pulses at t4-t12 and storage elements reach state C after program pulses at t8-t15. Further, the step size $\Delta$Vpgm1 is used for program pulses at t0-t12, the step size $\Delta$Vpgm3 is used only for the program pulse at t13 and the step size $\Delta$Vpgm2 is used for program pulses at t14 and t15.

Note that the relatively wide C-state distribution 1410 of FIG. 14 may be achieved using the series of programming pulses of FIG. 16. However, as mentioned, this is acceptable as the C-state storage elements can still be read with sufficient accuracy. Further, the use of the larger step sizes and the resulting larger absolute Vpgm can speed programming of the C-state storage elements which have not yet reached their intended state, compared to the series of programming pulses of FIGS. 13 and 15, which require additional pulses, and additional programming time, to reach the same absolute Vpgm. This increase in programming speed (or reduction in programming time) is depicted by the series of programming pulses of FIG. 16 including one fewer pulse than in FIG. 15, as an example (e.g., 15 vs. 16 program pulses).

Figure 17A:
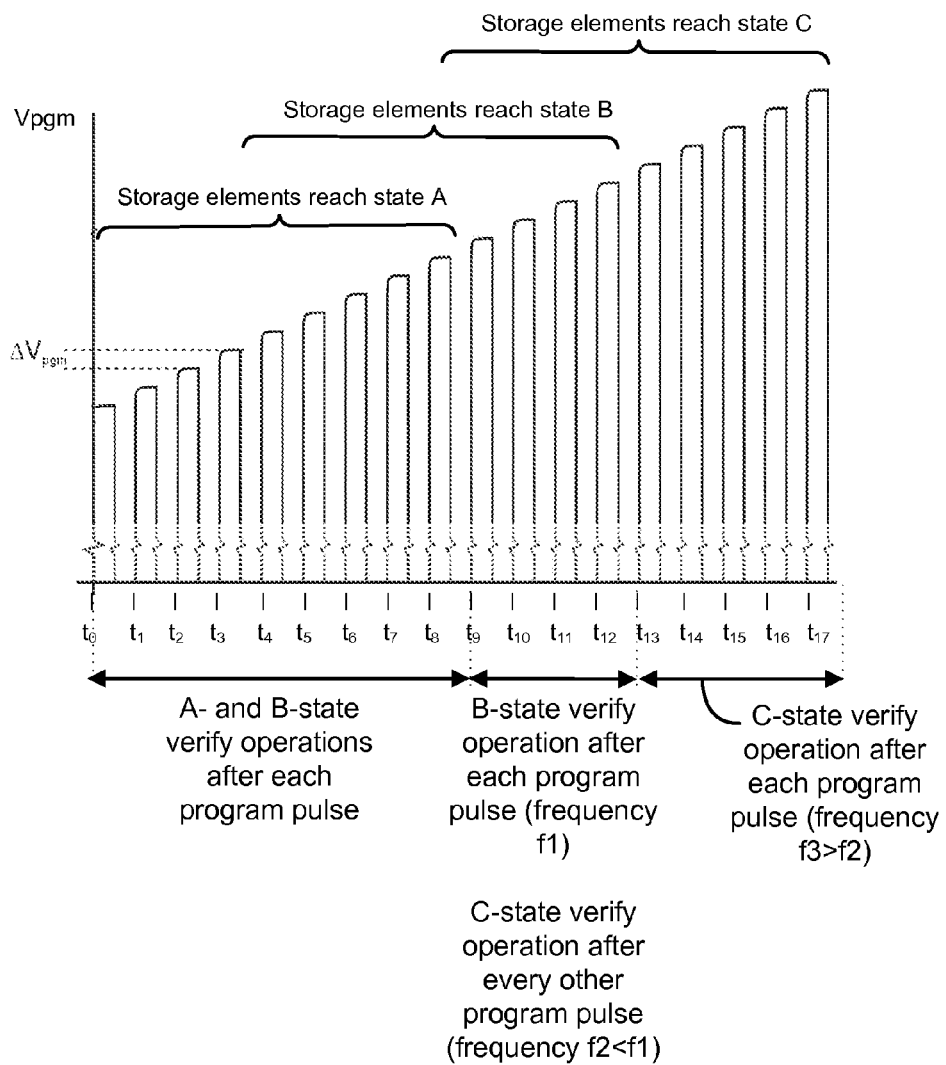
FIG. 17a illustrates a series of programming pulses with a fixed increment $\Delta Vpgm$ for programming multi-level non-volatile storage elements, where an example verify process is depicted.

FIG. 17a illustrates a series of programming pulses with a fixed increment $\Delta$Vpgm for programming multi-level non-volatile storage elements, where an example verify process is depicted. The series of program pulses is the same as depicted in FIG. 13. However, verify operations for states A, B and C are also depicted. Note that while some examples provided herein refer to four state multi-level storage elements which have an erased state and three higher states, referred to as A, B and C states, the techniques are generally applicable to any number of states. For example, storage elements with eight, sixteen or more states can be used.

Here, verify operations occur after every program pulse for storage elements which are intended to be programmed to the A- and B-states. In another approach, for the first few pulses, e.g., from t0-t3, only the A-state is verified, while for, e.g., t4-t8, both A- and B-state cells are verified. These verify operations occur after the program pulses at t0-t8, for example, which form a subset of all programming pulses. For storage elements which are intended to be programmed to the highest state, which is the C-state in this example, verify operations are not performed after the program pulses at t0-t8. This is due to knowledge that it would be unusual for some storage elements to program so much quicker than others that they would reach the C-state before all others have reached at least the A-state. However, many variations are possible and C-state verifying can begin sooner or later than depicted. In one approach, the first C-state verify is performed after a specified number of B-state storage elements have been verified to have reached their intended state and a specified number of additional program pulses have been applied. In one possible implementation which is depicted, the first C-state verify is performed after the program pulse at t9, after a first B-state storage element has been verified to have reached its intended state (after the program pulse at t3) and six additional program pulses have been applied. In another approach, the first C-state verify is performed after all or a specified number of A-state storage elements have been verified to have reached their intended state. Many variations are possible.

Further, verify operations continue to occur after each program pulse for state B for another subset of program pulses at t9-t12. Verify operations also begin for C-state storage elements in the subset of program pulses at t9-t12. In particular, verify operations for the C-state storage elements can occur after every other program pulse in the subset of program pulses at t9-t12 rather than after every program pulse. Generally, n1 verify operations can be performed for the B-state storage elements while n2 verify operations are performed for the C-state storage elements, in the subset of program pulses at t9-t12, where n1>n2. In other words, in the subset of program pulses at t9-t12, the frequency with which verify operations are performed for state C is less than the frequency with which verify operations are performed for state B, where the frequency can denote, e.g., the reciprocal of the number of verify operations, e.g., f1=1/n1 and f2=1/n2, and f2<f1. For instance, C-state verify operations can be performed after program pulses at t9 and t11 (but not after t10 and t12). Thus, in one approach, for the subset of program pulses at t9-t12, a C-state verify operation occurs between an initial program pulse in the subset at t9 and an immediately subsequent programming pulse in the subset at t10. Also, a next C-state verify operation occurs between the program pulses at t11 and t12.

Generally, as mentioned, verify operations can be performed less frequently, at least initially, for the highest state, e.g., state C, since a wider threshold voltage distribution for the highest state can be tolerated. This is true because only one verify level is needed to distinguish state C because it has only one adjacent neighbor state, state B.

Once a specified condition is met, the frequency with which verify operations are performed for the highest state can be increased. For example, C-state verify operations can be performed after every program pulse for a subset of program pulses at t13-t17. Or, more generally, C-state verify operations can be performed with a frequency f3 for program pulses t13-t17, where f3>f2. In one possible case, f3=f1. Also, the frequency with which verify operations are performed for the highest state can increase in two or more stages over respective subsets of program pulses. Again, the specific time points mentioned are examples only. Thus, in one case, f2=one C-state verify per 2 program pulses (or ½ C-state verify per program pulse) and f3=1 C-state verify per program pulse.

Different specified conditions can trigger a change in the frequency with which verify operations are performed. For example, the C-state verify operations can be performed after every program pulse starting when: a) all or almost all B-state storage elements have finished programming, that is, have been programmed to their intended state, or b) condition a) is met and an additional specified number (one or more) of program pulses have been applied, or c) a specified number (one or more) of C-state storage elements have reached their intended state, or d) condition c) is met and an additional specified number (one or more) of program pulses have been applied, or e) a specified number of total program pulses (since t0) have been applied.

In this approach, C-state programming operations will stop exactly after all or almost all C-state storage elements are programmed to the C-state, and thus an increase in Vpgm which can cause program disturb can be avoided since the total number of C-state verify operations can be reduced and thus the total programming time can be reduced.

Figure 17B:
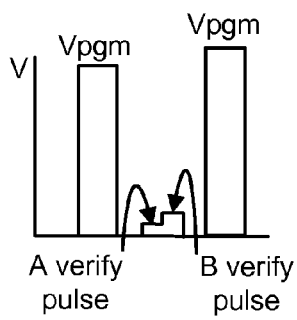
FIG. 17b depicts verify pulses for the A and B states.

FIG. 17b depicts verify pulses for the A and B states. In the example of FIG. 17a, only A- and B-state verify operations are performed after every program pulse for times t0-t8. As before, in another approach, for the first few pulses, e.g., from t0-t3, only the A-state is verified, while for, e.g., t4-t8, both A- and B-state cells are verified. Specifically, after an example program pulse, an A verify pulse is applied to the selected word line and a determination is made as to whether the threshold voltage of one or more selected storage elements which are intended to be programmed to the A state exceeds the amplitude of the verify pulse, e.g., in which case the selected storage element is in the off or non-conductive state, or the threshold voltage of the storage element does not exceed the amplitude of the verify pulse, e.g., in which case the storage element is in the on or conductive state. For traditional programming, if the threshold voltage of a storage element which is intended to be programmed to the A-state exceeds the verify level, then the storage element has completed programming and is inhibited from further programming, such as by raising the voltage of the associated bit line. Further, when coarse/fine programming is used, the verify levels can be lower (Vver2) or upper (Vver1) verify levels which are associated with state A. When the threshold voltage of a storage element which is intended to be programmed to state A exceeds the lower but not upper verify level for that state, programming continues for one or more program pulses at a partially inhibited rate. When the threshold voltage of a storage element exceeds the upper verify level for that state, programming is fully inhibited.

Subsequently, a B verify pulse, at a higher amplitude than the A verify pulse, is applied to the selected word line and a determination is made as to whether the threshold voltage of a selected storage element which is intended to be programmed to the B state exceeds the amplitude of the verify pulse, in which case the storage element has completed programming and is inhibited from further programming, when traditional programming is used. The process is modified as discussed when coarse/fine programming is used, in which case lower and upper verify levels which are associated with state B are used, and programming is partially or fully inhibited.

Figure 17C:
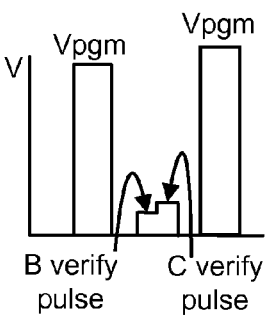
FIG. 17c depicts verify pulses for the B and C states, where C-state verify is not skipped.

FIG. 17c depicts verify pulses for the B and C states, where C-state verify is not skipped. In the example of FIG. 17a, B-state verify operations are performed after each of the program pulses for times t9-t12, while C-state verify operations are performed after only some of the program pulses for times t9-t12, e.g., when the C-state verify is not skipped. After an example program pulse, a B verify pulse is applied to the selected word line and a determination is made as to whether the threshold voltage of one or more selected storage elements which are intended to be programmed to the B state exceeds the amplitude of the verify pulse, in which case the storage element has completed programming and is inhibited from further programming, when traditional programming is used. The process is modified as discussed when coarse/fine programming is used, in which case lower and upper verify levels which are associated with state B are used, and programming is partially or fully inhibited.

Subsequently, a C verify pulse, at a higher amplitude than the B verify pulse, is applied to the selected word line and a determination is made as to whether the threshold voltage of one or more selected storage elements which are intended to be programmed to the C state exceeds the amplitude of the verify pulse. If the threshold voltage of a storage element which is intended to be programmed to the C-state exceeds the verify level, then the storage element has completed programming and is inhibited from further programming, when traditional programming is used. Subsequently, the next program pulse is applied.

Figure 17D:
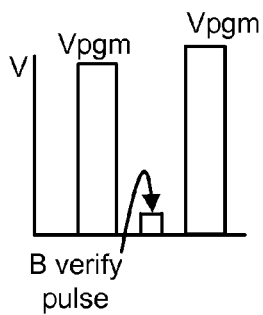
FIG. 17d depicts a verify pulse for the B state, where C-state verification is skipped.

FIG. 17d depicts a verify pulse for the B state, where C-state verification is skipped. As mentioned, C-state verification can be performed less frequently than after every program pulse. In other words, after the first C-state verification occurs for a given program pulse, C-state verification can be skipped after some subsequent program pulses. In the example of FIG. 17a, B-state verify operations are performed after every program pulse for times t9-t12 while C-state verify operations are performed less frequently, such as after every other program pulse, for times t9-t12. When C-state verification is skipped, only B-state verification is performed, in this example. In this case, after an example program pulse, a B verify pulse is applied to the selected word line and a determination is made as to whether the threshold voltage of one or more selected storage elements which are intended to be programmed to the B state exceeds the amplitude of the verify pulse, in which case the storage element has completed programming and is inhibited from further programming, when traditional programming is used. The process is modified as discussed when coarse/fine programming is used, in which case lower and upper verify levels which are associated with state B are used, and programming is partially or fully inhibited.

Subsequently, the next program pulse is applied, after which both B- and C-state verify pulses may be applied, as shown in FIG. 17c, in one possible approach. Note that programming time is reduced when the C-state verify is skipped since the next programming pulse can be applied sooner than when the C-state verify is not skipped.

Figure 17E:
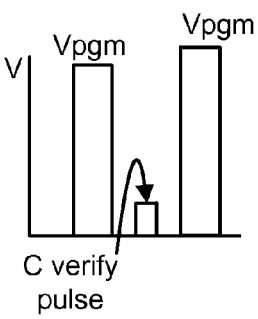
FIG. 17e depicts a verify pulse for the C state.

FIG. 17e depicts a verify pulse for the C state. In the example of FIG. 17a, only C-state verify operations are performed after program pulses for times t13-t17. After an example program pulse, a C verify pulse is applied to the selected word line and a determination is made as to whether the threshold voltage of one or more selected storage elements which are intended to be programmed to the C state exceeds the amplitude of the verify pulse, in which case the storage element has completed programming and is inhibited from further programming, when traditional programming is used. Subsequently, the next program pulse is applied if one or more other C-state storage elements have not yet completed programming.

Figure 18:
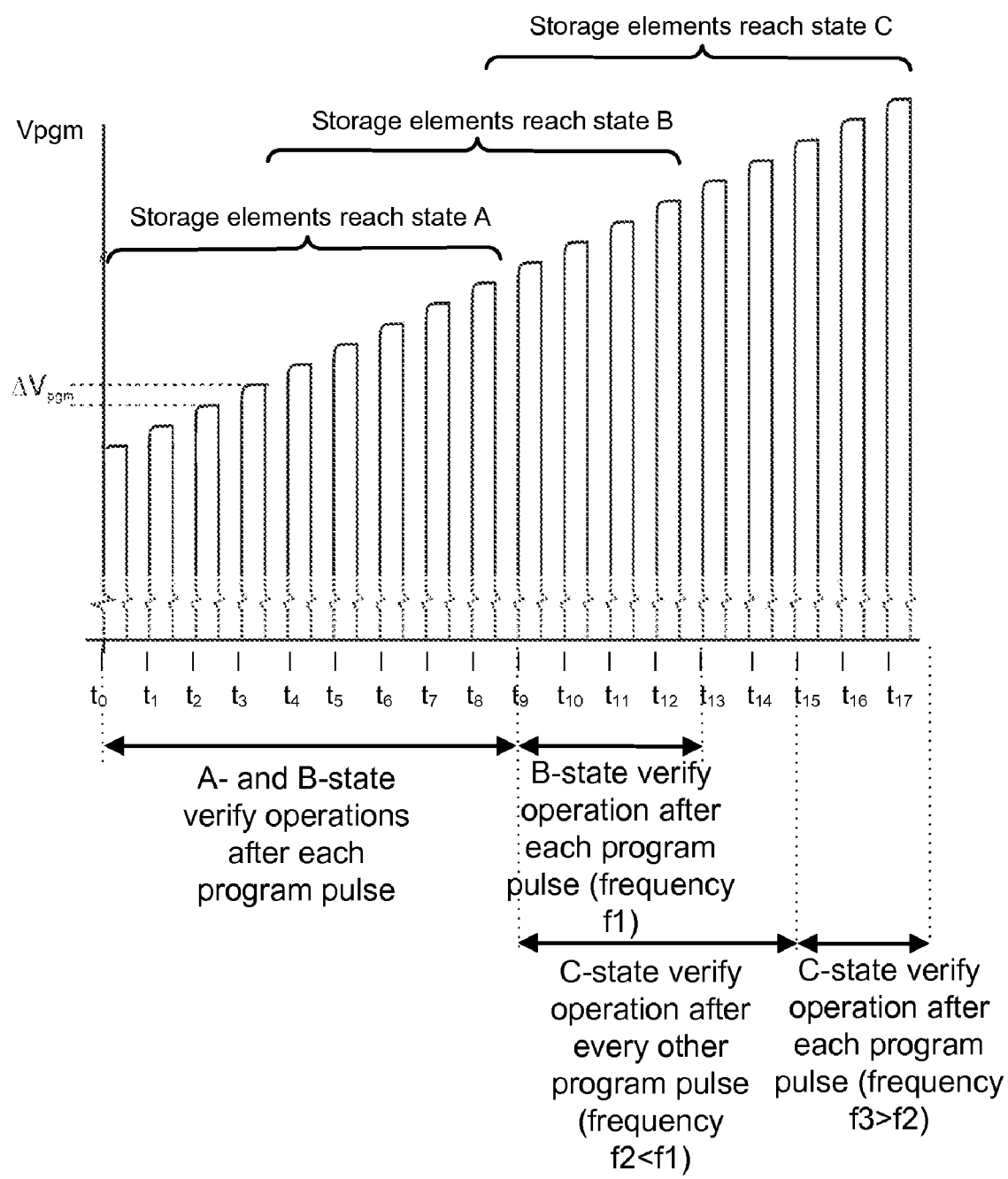
FIG. 18 illustrates a series of programming pulses with a fixed increment $\Delta Vpgm$ for programming multi-level non-volatile storage elements, where an alternative example verify process is depicted.

FIG. 18 illustrates a series of programming pulses with a fixed increment ΔVpgm for programming multi-level non-volatile storage elements, where an alternative example verify process is depicted. In this example, C-state verify operations are performed with a frequency f2 after program pulses at t9-t14, and with a frequency f3 after program pulses at t15-t17, where f3>f2. Compared to FIG. 17a, the C-state verify operations are performed with the frequency f2 for a longer period which includes two additional program pulses (t13 and t14). B-state verify operations are performed after each program pulse, or otherwise with a frequency f1, where f2<f1. C-state verify operations are performed with a frequency f3>f2 during a period which includes program pulses at t15-t17. In this example, the initiation of the C-state verify process at the frequency of f3 is delayed until after all or almost all B-state storage elements have been verified to have completed programming, and two additional program pulses have been applied. As mentioned, the initiation of the C-state verify process at the frequency of f3 can be triggered by different conditions, such as: a) when all or almost all B-state storage elements have finished programming and an additional specified number of program pulses have been applied, or b) when a specified number or portion of C-state storage elements have reached their intended state, or c) condition b) is met and an additional specified number of program pulses have been applied.

For example, the specified number or portion of C-state storage elements may be a majority or almost all of the C-state storage elements. In this way, the number of C-state verify operations is reduced further while Vpgm is kept low to avoid or minimize program disturb.

FIG. 19a illustrates an example process for verifying C-state storage elements. Step 1900 includes beginning a verify decision process for the C-state. Decision step 1905 includes determining whether a first condition is met. If the first condition is not met, the C-state verify process is not started (step 1910), and the next program pulse is applied (step 1915). When the first condition is met, a first, lowest frequency is used for the C-state verify (step 1920). A next program pulse is applied at step 1925. If a second condition is met at decision step 1930, a second, mid-range frequency is used for the C-state verify (step 1935) and a next program pulse is applied at step 1940. If the second condition is not met, the first frequency continues to be used for the C-state verify. If a third condition is met at decision step 1945, a third, highest frequency is used for the C-state verify (step 1950) and a next program pulse is applied at step 1955. If the third condition is not met, the second frequency continues to be used for the C-state verify. If programming is completed at decision step 1960, the process ends at step 1965. Otherwise, the third frequency continues to be used for the C-state verify.

In one possible implementation, the first condition may be met when one or more B-state storage elements have finished programmed and an additional number of program pulses have been applied, the second condition may be met when a first specified number of storage elements have been programmed to the C-state, and the third condition may be met when a second specified number of storage elements have been programmed to the C-state. Various other conditions may be used as well. Further, the C-state verify can be performed after every three program pulses using the first frequency, after every two program pulses using the second frequency and after every program pulse using the third frequency. Empirical testing can be performed to determine which frequencies, and the number of different frequencies, are suitable while maintaining acceptable programming accuracy.

Again, this example assumes that the C-state is the highest state. The process can be modified accordingly for other configurations. Further, the process can be performed in parallel for more than one of the highest states. Moreover, while three different frequencies are used for the C-state verify process, the technique can use two or more frequencies. Further, note that essentially any pattern of C-state verify skipping can be used. For example, after a first C-state verify is performed, the C-state verify may be skipped after the next three program pulses, then another C-state verify may be performed, then the C-state verify may be skipped after the next two program pulses, then another C-state verify may be performed, then the C-state verify may be skipped after the next program pulse, and then a C-state verify may be performed after each subsequent program pulse.

Figure 19B:
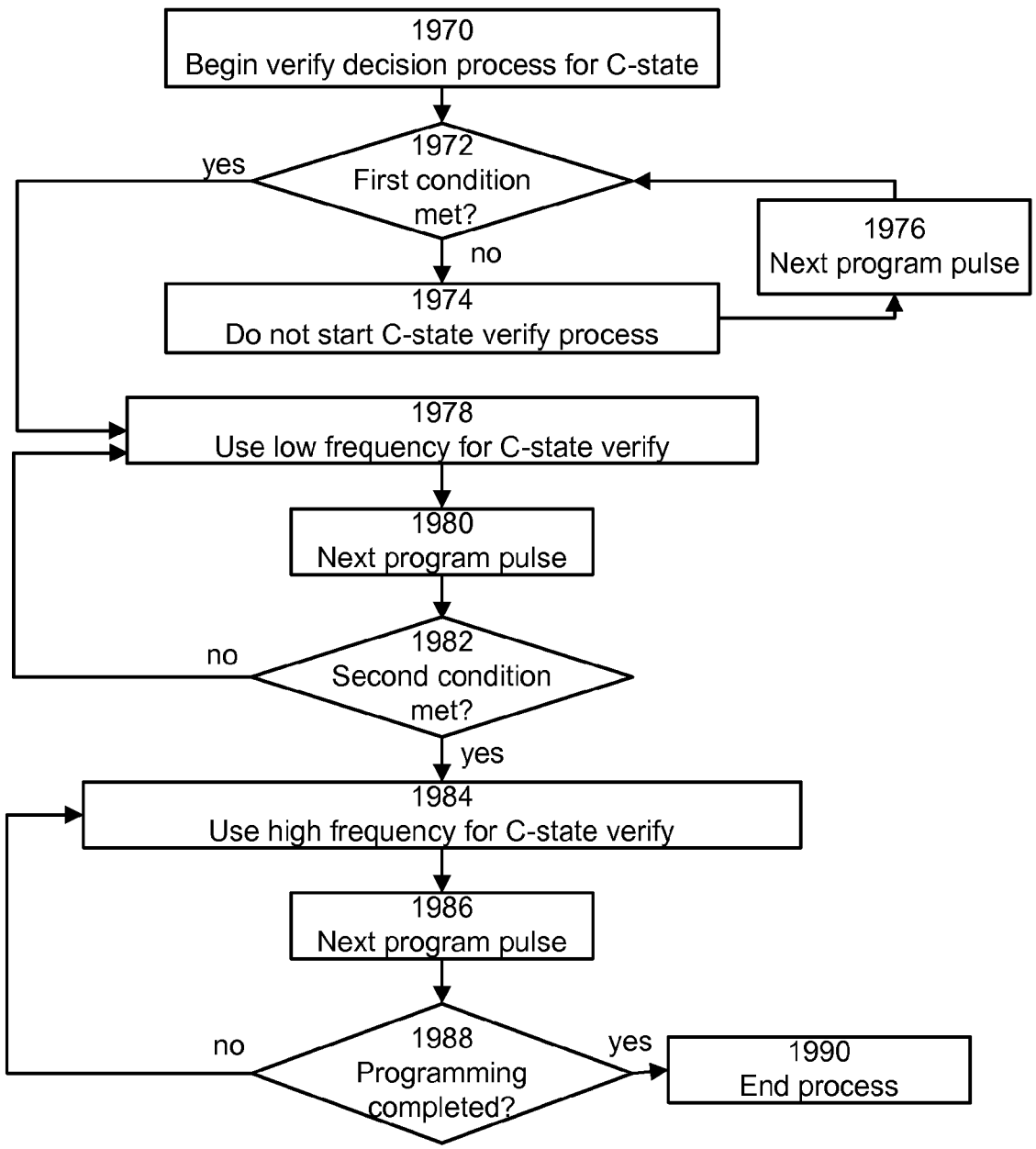
FIG. 19b illustrates another example process for verifying C-state storage elements.

FIG. 19b illustrates another example process for verifying C-state storage elements. This example can be considered to be a subset of the process of FIG. 19a, and encompasses FIG. 18 as it involves only two different frequencies for performing C-state verify operations. Step 1970 includes beginning a verify decision process for the C-state. Decision step 1972 includes determining whether a first condition is met. If the first condition is not met, the C-state verify process is not started (step 1974), and the next program pulse is applied (step 1976). When the first condition is met, a low frequency is used for the C-state verify (step 1978). For example, the low frequency may be f2 in FIG. 18. A next program pulse is applied at step 1980. If a second condition is met at decision step 1982, a high frequency is used for the C-state verify (step 1984) and a next program pulse is applied at step 1986. For example, the high frequency may be f3 in FIG. 18. If the second condition is not met, the low frequency continues to be used for the C-state verify (step 1978). If programming is completed at decision step 1988, the process ends at step 1990. Otherwise, the high frequency continues to be used for the C-state verify (step 1984). Note that the low and high frequencies can differ from the lowest and highest frequencies discussed in connection with FIG. 19*a*, and can be any suitable frequencies. Further, the first and second conditions can vary from those in FIG. 19*a*, and can be any suitable frequencies.

Figure 20:
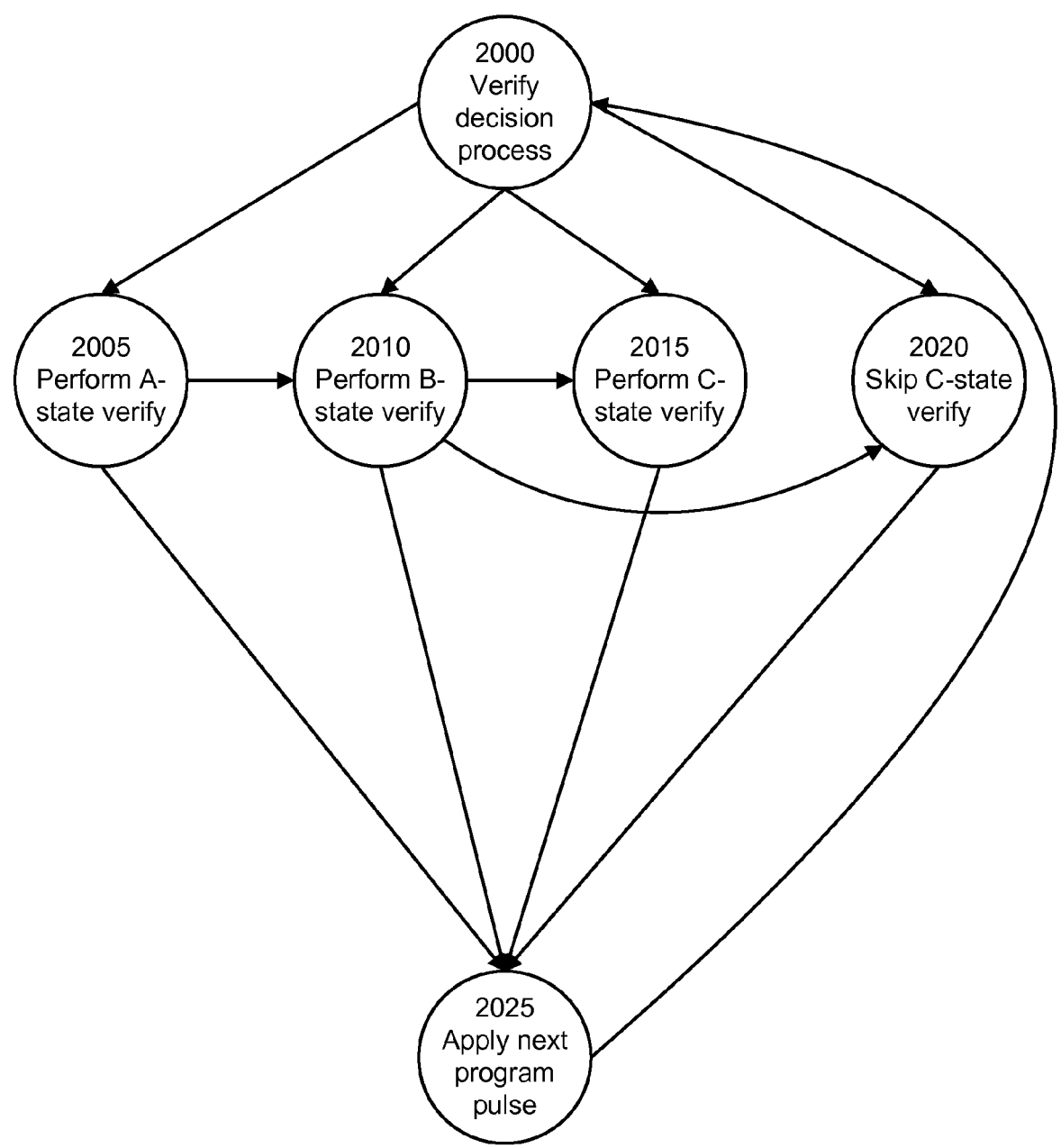
FIG. 20 illustrates an example state diagram for a verify decision process.

FIG. 20 illustrates an example state diagram for a verify decision process. For each program pulse, a decision is made at state 2000 as to which verify scheme to implement. For example, this can include determining a frequency with which verify operations are performed for the highest state. In a first possible case, only an A-state verify is performed (state 2005) and the next program pulse is applied (state 2025). In a second possible case, an A-state verify is performed (state 2005), a B-state verify is performed (state 2010) and the next program pulse is applied (state 2025). In a third possible case, an A-state verify is performed (state 2005), a B-state verify is performed (state 2010), a C-state verify is performed (state 2015), and the next program pulse is applied (state 2025). In a fourth possible case, an A-state verify is performed (state 2005), a B-state verify is performed (state 2010), a C-state verify is skipped (state 2020), and the next program pulse is applied (state 2025). Generally, a C-state verify can be skipped after at least one C-state verify has been performed in a given set of program pulses.

In a fifth possible case, only a B-state verify is performed (state 2010) and the next program pulse is applied (state 2025). In a sixth possible case, a B-state verify is performed (state 2010), a C-state verify is performed (state 2015), and the next program pulse is applied (state 2025). In a seventh possible case, a B-state verify is performed (state 2010), a C-state verify is skipped (state 2020), and the next program pulse is applied (state 2025).

In an eighth possible case, only a C-state verify is performed (state 2015) and the next program pulse is applied (state 2025). In a ninth possible case, a C-state verify is skipped (state 2020), and the next program pulse is applied (state 2025), so that no verify is performed.

The state diagram depicted is an example only and can be modified for different numbers of programming states and different state transitions. The most common case is that first only A-verify operations are performed, and after a certain number of pulses, A and B state verify operations are performed. Appropriate control circuitry can be configured for achieving a desired verify scheme.

Figure 21:
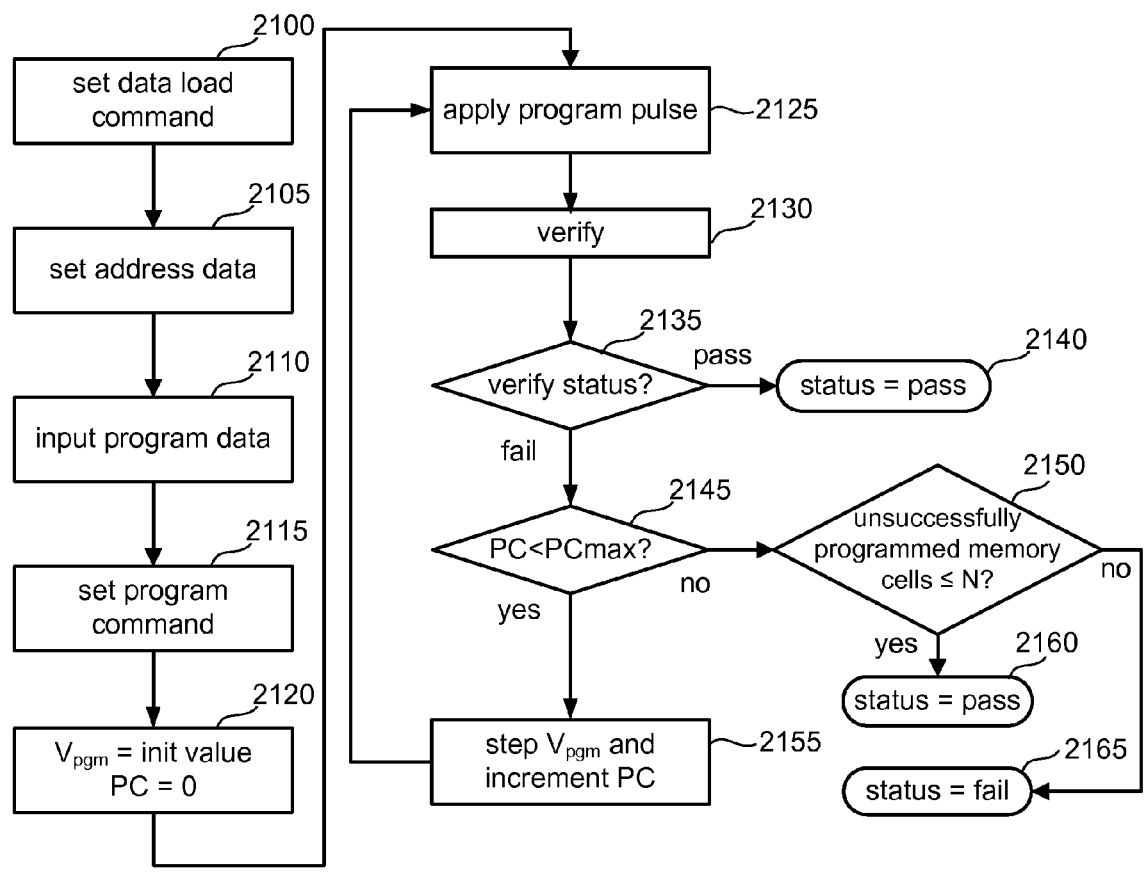
FIG. 21 is a flow chart describing one embodiment of a process for programming non-volatile memory.

FIG. 21 is a flow chart describing one embodiment of a method for programming non-volatile memory. In one implementation, storage elements are erased (in blocks or other units) prior to programming. Storage elements are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

In step 2100, a "data load" command is issued by the controller and received by control circuitry 310. In step 2105, address data designating the page address is input to decoder 314 from the controller or host. In step 2110, a page of program data for the addressed page is input to a data buffer for programming. That data is latched in the appropriate set of latches. In step 2115, a "program" command is issued by the controller to state machine 312.

Triggered by the "program" command, the data latched in step 2110 will be programmed into the selected storage elements controlled by state machine 312 using a series of programming waveforms, as discussed previously, applied to the appropriate word line. In step 2120, the program voltage Vpgm is initialized to the starting pulse (e.g., 12 V or other value) and a program counter PC maintained by state machine 312 is initialized at 0. In particular, each of the multilevel portions of the programming waveform can be initialized to a respective starting level. The magnitude of the initial program pulse can be set, e.g., by properly programming a charge pump. At step 2125, the first program pulse is applied to the selected word line.

If logic "0" is stored in a particular data latch indicating that the corresponding storage element should be programmed, then the corresponding bit line is grounded for a portion of each waveform based on the state to which the storage element is to be programmed. On the other hand, if logic "1" is stored in the particular latch indicating that the corresponding storage element should remain in its current data state, then the corresponding bit line is connected to Vdd to inhibit programming.

At step 2130, the states of the selected storage element are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected storage elements have been programmed. At step 2135, it is checked whether all of the data latches are storing logic "1." If so, the programming process is complete and successful because all selected memory storage elements were programmed and verified to their target states. A status of "PASS" is reported at step 2140. Optionally, a pass can be declared at step 2135 even when some of the memory elements have not yet reached their desired state. Thus, even if a certain number of storage elements can not reach the desired state, programming can stop before the maximum number of loops is reached.

If, at step 2135, it is determined that not all of the data latches are storing logic "1," then the programming process continues. At step 2145, the program counter PC is checked against a program limit value, PCmax. One example of a program limit value is twenty, however, other values can be used in various implementations. If the program counter PC is not less than PCmax, then it is determined at step 2150 whether the number of storage elements that have not been successfully programmed is equal to or less than a predetermined number, N. If the number of unsuccessfully programmed storage elements is equal to or less than N, the programming process is flagged as passed and a status of pass is reported at step 2160. The storage elements that are not successfully programmed can be corrected using error correction during the read process. If however, the number of unsuccessfully programmed storage elements is greater than the predetermined number, the program process is flagged as failed, and a status of fail is reported at step 2165. If the program counter PC is less than PCmax, then the Vpgm level is increased by the step size and the program counter PC is incremented at step 2155. In particular, each portion of the Vpgm waveform can be increased by the step size. After step 2155, the process loops back to step 2125 to apply the next program pulse.

The flowchart depicts a single-pass programming method as can be applied for multi-level storage, such as depicted in FIG. 7. In a two-pass programming method, such as depicted in FIGS. 8 and 9a-f, multiple programming or verification steps may be used in a single iteration of the flowchart. Steps 2120-2165 may be performed for each pass of the programming operation. In a first pass, one or more program waveforms may be applied and the results thereof verified to determine if a storage element is in the appropriate intermediate state. In a second pass, one or more program waveforms may be applied and the results thereof verified to determine if the storage element is in the appropriate final state. At the end of a successful program process, the threshold voltages of the memory storage elements should be within one or more distributions of threshold voltages for programmed memory storage elements or within a distribution of threshold voltages for erased memory storage elements.

The techniques provided herein can in principal be used in all multi-level types of memories, not limited to NAND and not limited to floating gate. For example, the techniques can be used with memories that use other charge storage layers than a floating gate, such as nitride and nanocrystals. The techniques can further be used in combination with conventional NAND flash memories, and all bit line types of NAND flash memories, and is especially useful for full-sequence programming, where all states are programmed at the same time.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming multi-level non-volatile storage, comprising:
    applying a set of programming pulses to a plurality of non-volatile storage elements, including a first group of non-volatile storage elements which are intended to be programmed to one state, and a second group of non-volatile storage elements which are intended to be programmed to another state;
    performing a number n1 of verify operations for one subset of programming pulses of the set of programming pulses to determine whether the non-volatile storage elements in the first group of non-volatile storage elements have reached the one state;
    performing a number n2 of verify operations for the one subset of programming pulses, including a verify operation between an initial programming pulse in the one subset of programming pulses and an immediately subsequent programming pulse, to determine whether the non-volatile storage elements in the second group of non-volatile storage elements have reached the another state, where n1>n2; and
    performing verify operations for another subset of programming pulses of the set of programming pulses which follows the one subset of programming pulses to determine whether the non-volatile storage elements in the second group of non-volatile storage elements have reached the another state, where, in determining whether the non-volatile storage elements in the second group of non-volatile storage elements have reached the another state, the verify operations for the another subset of programming pulses are performed more frequently than the verify operations for the one subset of programming pulses.

2. The method of claim 1, wherein:
the another state is higher than the one state and the one state is higher than an erased state.

3. The method of claim 1, wherein:
the another state is a highest state to which any of the non-volatile storage elements is programmed.

4. The method of claim 1, further comprising:
performing verify operations for a further subset of programming pulses of the set of programming pulses which follows the another subset of programming pulses to determine whether the non-volatile storage elements in the second group of non-volatile storage elements have reached the another state, where, in determining whether the non-volatile storage elements in the second group of non-volatile storage elements have reached the another state, the verify operations for the further subset of programming pulses are performed more frequently than the verify operations for the one another subset of programming pulses.

5. The method of claim 1, wherein:
the another subset of programming pulses is applied to the plurality of non-volatile storage elements based on a determination that a specified number of non-volatile storage elements in the first group of non-volatile storage elements have been verified to be programmed to the one state.

6. The method of claim 1, wherein:
the another subset of programming pulses is applied to the plurality of non-volatile storage elements based on a determination that a specified number of the non-volatile storage elements in the second group of non-volatile storage elements have been verified to be programmed to the another state.

7. The method of claim 1, wherein:
the another subset of programming pulses is applied to the plurality of non-volatile storage elements based on a determination that a specified number of the non-volatile storage elements in the first group of non-volatile storage elements have been verified to be programmed to the one state, and a specified number of additional programming pulses have been applied.

8. The method of claim 1, wherein:
the set of programming pulses is applied to the plurality of non-volatile storage elements via a common word line.

9. A non-volatile storage system, comprising:
a plurality of non-volatile storage elements; and
at least one control circuit associated with the plurality of non-volatile storage elements, the at least one control circuit: a) applies a set of programming pulses to the plurality of non-volatile storage elements, including a first group of non-volatile storage elements which are intended to be programmed to a one state, and a second group of non-volatile storage elements which are intended to be programmed to a another state, b) performs a number n1 of verify operations for one subset of programming pulses of the set of programming pulses to determine whether the non-volatile storage elements in the first group of non-volatile storage elements have reached the one state, and c) performs a number n2 of verify operations for the one subset of programming pulses, including a verify operation between an initial programming pulse in the one subset of programming pulses and an immediately subsequent programming pulse, to determine whether the non-volatile storage elements in the second group of non-volatile storage elements have reached the another state, where n1>n2, the at least one control circuit performs verify operations for another subset of programming pulses of the set of programming pulses which follows the one subset of programming pulses to determine whether the non-volatile storage elements in the second group of non-volatile storage elements have reached the second another state, where, in determining whether the non-volatile storage elements in the second group of non-volatile storage elements have reached the second another state, the verify operations for the another subset of programming pulses are performed more frequently than the verify operations for the one subset of programming pulses.

10. The non-volatile storage system of claim 9, wherein: the another state is higher than the one state and the one state is higher than an erased state.

11. The non-volatile storage system of claim 9, wherein: the another state is a highest state to which any of the non-volatile storage element is programmed.

12. The non-volatile storage system of claim 9, wherein: the at least one control circuit performs verify operations for a further subset of programming pulses of the set of programming pulses which follows the another subset of programming pulses to determine whether the non-volatile storage elements in the second group of non-volatile storage elements have reached the another state, where, in determining whether the non-volatile storage elements in the second group of non-volatile storage elements have reached the another state, the verify operations for the further subset of programming pulses are performed more frequently than the verify operations for the another subset of programming pulses.

13. The non-volatile storage system of claim 9, wherein: the another subset of programming pulses is applied to the plurality of non-volatile storage elements based on a determination that a specified number of non-volatile storage elements in the first group of non-volatile storage elements have been verified to be programmed to the one state.

14. The non-volatile storage system of claim 9, wherein: the another subset of programming pulses is applied to the plurality of non-volatile storage elements based on a determination that a specified number of the non-volatile storage elements in the second group of non-volatile storage elements have been verified to be programmed to the another state.

15. The non-volatile storage system of claim 9, wherein: the another subset of programming pulses is applied to the plurality of non-volatile storage elements based on a determination that a specified number of the non-volatile storage elements in the first group of non-volatile storage elements have been verified to be programmed to the one state, and a specified number of additional programming pulses have been applied.

16. The non-volatile storage system of claim 9, wherein: the set of programming pulses is applied to the plurality of non-volatile storage elements via a common word line.

17. A method for programming multi-level non-volatile storage, comprising:
applying a set of programming pulses to a plurality of non-volatile storage elements, including a first group of non-volatile storage elements which are intended to be programmed to one state, and a second group of non-volatile storage elements which are intended to be programmed to another state;
performing a number n1 of verify operations for one subset of programming pulses of the set of programming pulses to determine whether the non-volatile storage elements in the first group of non-volatile storage elements have reached the one state;
performing a number n2 of verify operations for the one subset of programming pulses, including a verify operation between an initial programming pulse in the one subset of programming pulses and an immediately subsequent programming pulse, to determine whether the non-volatile storage elements in the second group of non-volatile storage elements have reached the another state, where n1>n2; and
the set of programming pulses includes at least one programming pulse before the one subset of programming pulses, and prior to the one subset of programming pulses, no verify operations are performed for the set of programming pulses to determine whether the non-volatile storage elements in the second group of non-volatile storage elements have reached the another state.

18. A non-volatile storage system, comprising:
a plurality of non-volatile storage elements; and
at least one control circuit associated with the plurality of non-volatile storage elements, the at least one control circuit: a) applies a set of programming pulses to the plurality of non-volatile storage elements, including a first group of non-volatile storage elements which are intended to be programmed to a one state, and a second group of non-volatile storage elements which are intended to be programmed to a another state, b) performs a number n1 of verify operations for one subset of programming pulses of the set of programming pulses to determine whether the non-volatile storage elements in the first group of non-volatile storage elements have reached the one state, and c) performs a number n2 of verify operations for the one subset of programming pulses, including a verify operation between an initial programming pulse in the one subset of programming pulses and an immediately subsequent programming pulse, to determine whether the non-volatile storage elements in the second group of non-volatile storage elements have reached the another state, where n1>n2, the set of programming pulses includes at least one programming pulse before the one subset of programming pulses, and prior to the one subset of programming pulses, no verify operations are performed for the set of programming pulses to determine whether the non-volatile storage elements in the second group of non-volatile storage elements have reached the second state.

* * * * *